(12) United States Patent
Seol et al.

(10) Patent No.: US 11,362,868 B2
(45) Date of Patent: Jun. 14, 2022

(54) NEUROMORPHIC DEVICE AND NEUROMORPHIC SYSTEM INCLUDING THE SAME

(71) Applicant: Samsung Electronics Co., Ltd., Suwon-si (KR)

(72) Inventors: Changkyu Seol, Osan-si (KR); Hongrak Son, Anyang-si (KR); Geunyeong Yu, Seongnam-si (KR); Pilsang Yoon, Hwaseong-si (KR); Jaehun Jang, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/911,801

(22) Filed: Jun. 25, 2020

(65) Prior Publication Data

US 2021/0160109 A1    May 27, 2021

(30) Foreign Application Priority Data

Nov. 25, 2019    (KR) .................. 10-2019-0152184

(51) Int. Cl.
*H04L 27/04* (2006.01)
*H04L 1/00* (2006.01)
(Continued)

(52) U.S. Cl.
CPC .............. *H04L 27/04* (2013.01); *G06N 3/04* (2013.01); *G06N 3/049* (2013.01); *G06N 3/063* (2013.01); *H04L 1/0061* (2013.01); *H04L 27/06* (2013.01)

(58) Field of Classification Search
CPC .......... G06N 3/04; G06N 3/049; G06N 3/063; H04L 1/0061; H04L 27/04; H04L 27/06
See application file for complete search history.

(56) References Cited

U.S. PATENT DOCUMENTS 9,037,524 B2    5/2015  Lee et al.
10,157,629 B2   12/2018 van der Made et al.
(Continued)

OTHER PUBLICATIONS

Young, Aaron et al., "A Review of Spiking Neuromorphic Hardware Communication Systems", Oct. 2019, IEEE Access, vol. 7, pp. 135607-20 (Year: 2019).*

*Primary Examiner* — David B Lugo
(74) *Attorney, Agent, or Firm* — Harness, Dickey & Pierce, P.L.C.

(57) ABSTRACT

A neuromorphic device includes a neuron block, a spike transmission circuit and a spike reception circuit. The neuron block includes a plurality of neurons connected by a plurality of synapses to perform generation and operation of spikes. The spike transmission circuit generates a non-binary transmission signal based on a plurality of transmission spike signals output from the neuron block and transmits the non-binary transmission signal to a transfer channel, where the non-binary transmission signal includes information on transmission spikes included in the plurality of transmission spike signals. The spike reception circuit receives a non-binary reception signal from the transfer channel and generates a plurality of reception spike signals including reception spikes based on the non-binary reception signal to provide the plurality of reception spike signals to the neuron block, where the non-binary reception signal includes information on the reception spikes.

18 Claims, 27 Drawing Sheets

(51) Int. Cl.
  *H04L 27/06* (2006.01)
  *G06N 3/063* (2006.01)
  *G06N 3/04* (2006.01)

(56) References Cited

U.S. PATENT DOCUMENTS

| | | | |
|---|---|---|---|
| 10,282,660 B2 | 5/2019 | Chan et al. | |
| 10,979,210 B1* | 4/2021 | Jones | H04L 27/3488 |
| 2013/0145238 A1* | 6/2013 | Alhussien | H03M 13/1154 |
| | | | 714/786 |
| 2013/0185237 A1* | 7/2013 | Heliot | G06N 3/02 |
| | | | 706/33 |
| 2014/0241211 A1* | 8/2014 | Zhang | H04L 27/264 |
| | | | 370/255 |
| 2015/0213356 A1 | 7/2015 | Canoy et al. | |
| 2015/0302295 A1* | 10/2015 | Rivera | G06N 3/04 |
| | | | 706/25 |
| 2015/0372805 A1* | 12/2015 | Yoon | H03M 3/30 |
| | | | 375/358 |
| 2016/0042271 A1* | 2/2016 | Yoon | G06N 3/04 |
| | | | 706/25 |
| 2017/0033120 A1* | 2/2017 | Lee | H01L 27/11575 |
| 2017/0300810 A1* | 10/2017 | Lee | G06N 3/049 |
| 2018/0012122 A1* | 1/2018 | Williams | G06Q 50/02 |
| 2018/0197076 A1 | 7/2018 | Paik et al. | |
| 2018/0225562 A1* | 8/2018 | van der Made | G06N 3/049 |
| 2018/0232635 A1 | 8/2018 | Oh et al. | |
| 2019/0042915 A1* | 2/2019 | Akin | G06N 3/049 |
| 2019/0042920 A1 | 2/2019 | Akin et al. | |
| 2019/0050721 A1 | 2/2019 | Busch et al. | |
| 2019/0081730 A1* | 3/2019 | Oveis Gharan | H03M 13/2906 |
| 2019/0138884 A1 | 5/2019 | Niggemeyer et al. | |
| 2019/0199560 A1* | 6/2019 | Bossard | H04L 27/06 |
| 2020/0019839 A1* | 1/2020 | Boahen | G06N 3/049 |
| 2020/0143229 A1* | 5/2020 | Van Der Made | G06N 3/088 |
| 2020/0344094 A1* | 10/2020 | Mishra | H04L 12/10 |
| 2020/0394502 A1* | 12/2020 | Chen | G06N 3/0635 |
| 2021/0056416 A1* | 2/2021 | Kato | G06N 3/04 |

* cited by examiner

FIG. 10

| DATA BITS | PARITY BITS | | |
|---|---|---|---|
| | SEC | SEC-DED | DEC |
| 8 | 4 | 5 | 8 |
| 64 | 7 | 8 | 14 |
| 128 | 8 | 9 | 16 |
| 256 | 9 | 10 | 18 |
| 512 | 10 | 11 | 20 |

NEUROMORPHIC DEVICE AND NEUROMORPHIC SYSTEM INCLUDING THE SAME

CROSS-REFERENCE TO RELATED APPLICATION

This U.S. non-provisional application claims priority under 35 USC § 119 to Korean Patent Application No. 10-2019-0152184, filed on Nov. 25, 2019, in the Korean Intellectual Property Office (KIPO), the disclosure of which is incorporated by reference herein in its entirety.

BACKGROUND

1. Technical Field

Example embodiments relate generally to semiconductor integrated circuits, and more particularly to a neuromorphic device and a neuromorphic system including the neuromorphic device.

2. Discussion of the Related Art

A human brain includes hundreds of billions of neurons that are connected in a complex neuromorphic network. A neuromorphic device emulates a human nervous system or a human brain. Unlike a structure in which an arithmetic unit, an instruction processor, and a storage unit are independently present and on which a typical computer central processing unit is based, a neuromorphic device may process information in parallel. The neuromorphic device may be defined by a two-dimensional or three-dimensional connection of a plurality of neurons. Each neuron may be configured with circuits corresponding to axon, dendrite, and soma in the same manner as constituent elements of a biological neuron. As the number of neurons forming a nervous system is increased, the efficiency of exchanging information between the neurons is degraded.

SUMMARY

Some example embodiments may provide a neuromorphic device and a neuromorphic system including the neuromorphic device, capable of more efficiently implementing a spiking neural network.

According to example embodiments, a neuromorphic device includes a neuron block, a spike transmission circuit and/or a spike reception circuit. The neuron block includes a plurality of neurons connected by a plurality of synapses to perform generation and operation of spikes. The spike transmission circuit generates a non-binary transmission signal based on a plurality of transmission spike signals output from the neuron block and transmits the non-binary transmission signal to a transfer channel, where the non-binary transmission signal includes information on transmission spikes included in the plurality of transmission spike signals. The spike reception circuit receives a non-binary reception signal from the transfer channel and generates a plurality of reception spike signals including reception spikes based on the non-binary reception signal to provide the plurality of reception spike signals to the neuron block, where the non-binary reception signal includes information on the reception spikes.

According to example embodiments, a neuromorphic system includes a plurality of neuromorphic devices and a transfer channel configured to electrically connecting the plurality neuromorphic devices. Each of the plurality of neuromorphic devices includes the neuron block, the spike transmission circuit and the spike reception circuit.

According to example embodiments, a neuromorphic device includes a neuron block including a plurality of neurons connected by a plurality of synapses to perform generation and operation of spikes, a spike transmission circuit configured to generate a pulse amplitude modulation (PAM) transmission signal based on a plurality of transmission spike signals output from the neuron block and configured to transmit the non-binary transmission signal to a transfer channel and a spike reception circuit configured to receive a PAM reception signal from the transfer channel. The spike transmission circuit includes a spike converter configured to generate transmission spike data including timing information of the transmission spikes based on a plurality of transmission spike signals output from the neuron block, a packetizer configured to generate a transmission packet based on the transmission spike data and a modulator configured to modulate the transmission packet to generate the PAM transmission signal. The spike reception circuit includes a demodulator configured to demodulate the PAM reception signal to generate a reception packet, a depacketizer configured to generate, based on the reception packet, reception spike data including timing information of the reception spikes and a spike generator configured to generate a plurality of reception spike signals based on the reception spike data.

The neuromorphic device and the neuromorphic system according to example embodiments may implement a spiking neural network efficiently by packetizing the spike signals and modulating the packet to transfer the spike signals as the non-binary signals.

BRIEF DESCRIPTION OF THE DRAWINGS

Example embodiments of the present disclosure will be more clearly understood from the following detailed description taken in conjunction with the accompanying drawings.

FIG. 10 is a diagram for describing error correction code (ECC) levels in a neuromorphic device according to example embodiments.

DETAILED DESCRIPTION OF EXAMPLE EMBODIMENTS

Figure 1:
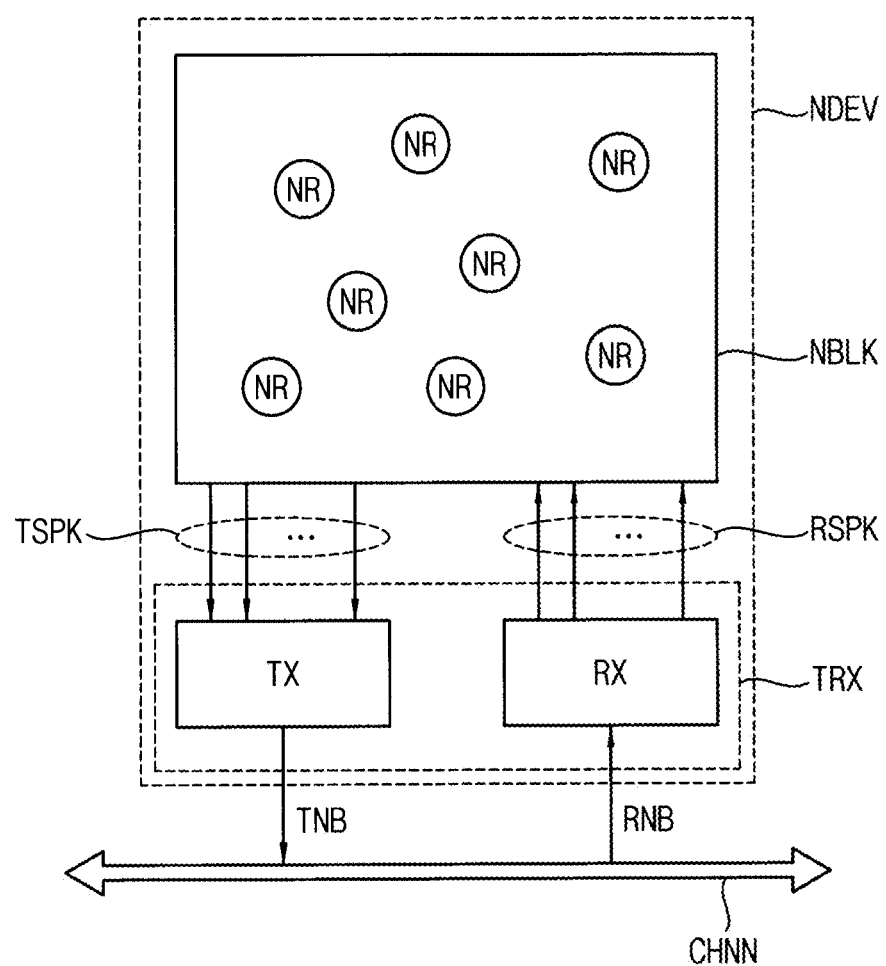
FIG. 1 is a block diagram illustrating a neuromorphic device according to example embodiments.

Various example embodiments will be described more fully hereinafter with reference to the accompanying drawings, in which some example embodiments are shown. In the drawings, like numerals refer to like elements throughout. The repeated descriptions may be omitted.

FIG. 1 is a block diagram illustrating a neuromorphic device according to example embodiments.

Referring to FIG. 1, a neuromorphic device NDEV includes a spike transmission circuit TX and/or a spike reception circuit RX. The combination of the spike transmission circuit TX and the spike reception circuit RX may be referred to as a spike transceiver circuit TRX.

The neuron block NBLK includes a plurality of neurons NR connected by a plurality of synapses to perform generation and operation of spikes. The neuron block NBLK may correspond to a neuromorphic core or a neuromorphic chip including a plurality of neuromorphic cores. The neuron block NBLK will be further described below with reference to FIGS. 2 through 5.

The spike transmission circuit TX generates a non-binary transmission signal TNB based on a plurality of transmission spike signals TSPK output from the neuron block NBLK and transmits the non-binary transmission signal TNB to a transfer channel CHNN. The non-binary transmission signal TNB include information on transmission spikes included in the plurality of transmission spike signals TSPK.

The spike reception circuit RX receives a non-binary reception signal RNB from the transfer channel CHNN and generates a plurality of reception spike signals RSPK including reception spikes based on the non-binary reception signal RNB to provide the plurality of reception spike signals RSPK to the neuron block NBLK. The non-binary reception signal RNB includes information on the reception spikes.

According to example embodiments, the non-binary transmission signal TNB and the non-binary reception signal RNB may be pulse-based signals. For example, the pulse-based signals may include pulse width modulation (PWM) signals, pulse amplitude modulation (PAM) signals, pulse position modulation (PPM) signals, etc. Particularly the non-binary signals transferred between a plurality of neuromorphic devices may be the PAM signals as will be described below with reference to FIGS. 11 through 15.

The neuromorphic device NDEV and the neuromorphic system including the neuromorphic device NDEV according to example embodiments may implement a spiking neural network efficiently by modulating the spike signals to transfer the spike signals as the non-binary signals.

Figure 2:
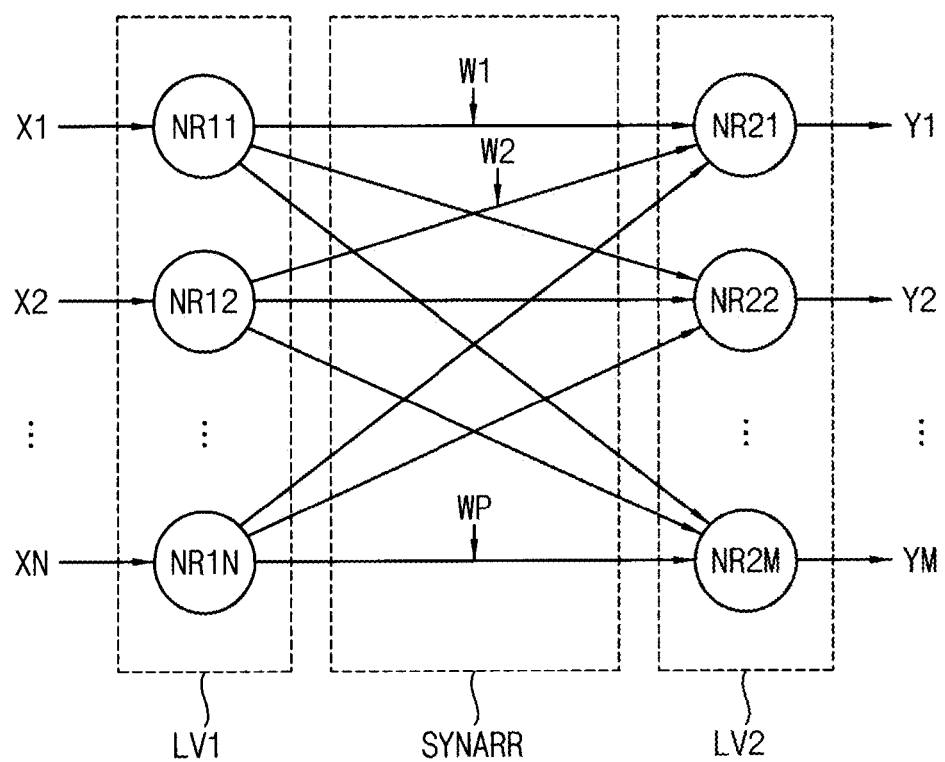
FIG. 2 is a diagram illustrating a spiking neural network according to example embodiments.
Figure 3:
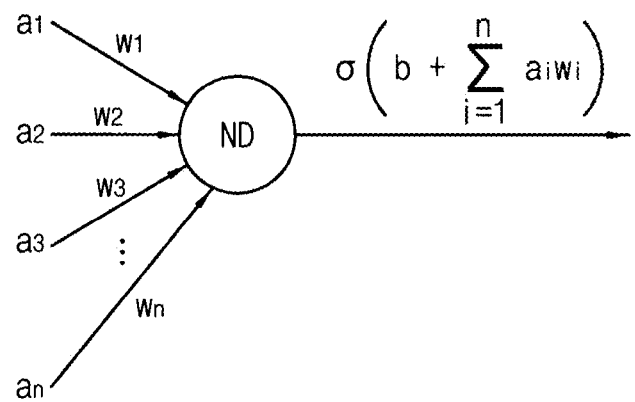
FIG. 3 is an example neuron in a spiking neural network according to example embodiments.
Figure 4:
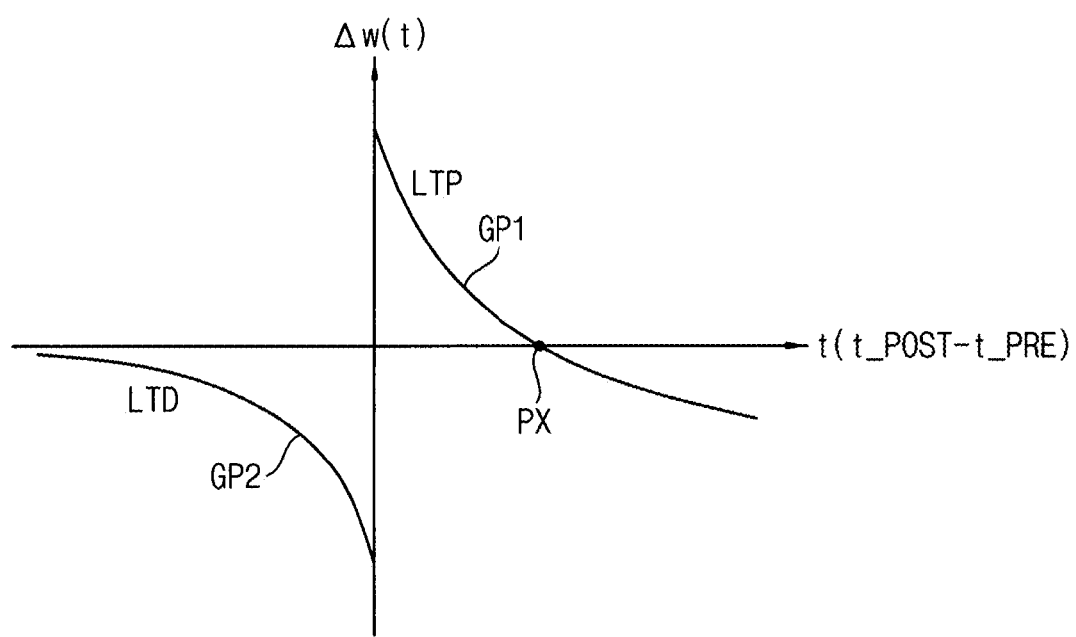
FIG. 4 is a diagram illustrating spike-timing-dependent plasticity (STDP) of a neuron.

FIG. 2 is a diagram illustrating a spiking neural network according to example embodiments, FIG. 3 is an example neuron in a spiking neural network according to example embodiments, and FIG. 4 is a diagram illustrating spike-timing-dependent plasticity (STDP) of a neuron.

Referring to FIG. 2, a spiking neural network may include neurons NR11~NR1N of a first level LV1 and neurons NR21~NR2M of a second level LV2 such that the neurons NR11~NR1N of the first level LV1 and the neurons NR21~NR2M of the second level LV2 may be connected through a synapse array SYNARR, that is, a network of synaptic connections (e.g., feed-forward connections). For simplicity, only two levels of neurons are illustrated in FIG. 2, although fewer or more levels of neurons may exist in the spiking neural network. It should be noted that some of the neurons may connect to other neurons of the same level through lateral connections. Furthermore, some of the neurons may connect back to a neuron of a previous level through feedback connections.

As illustrated in FIG. 2, each neuron in the first level LV1 may receive an input signal X1~XN that may be generated by neurons of a previous level (not shown in FIG. 2). The current, which is applied to each neuron of the first level LV1 may be accumulated on an neuron membrane of each neuron to charge a membrane potential. When the membrane potential reaches its threshold value, the neuron may fire and generate an output spike to be transferred to the next level of neurons (e.g., the neurons of the second level LV2). In some modeling approaches, the neuron may continuously transfer a signal to the next level of neurons. This signal is typically a function of the membrane potential. Such behavior can be emulated or simulated in hardware and/or software, including analog and digital implementations.

In transferring spikes from one level of neurons to another level of neurons, transferred information may be represented only by the frequency and number of spikes, or the timing of spikes, rather than by the amplitude. The importance of the spikes may be determined by a weight applied to a connection between neurons, as explained below.

The transfer of spikes from one level of neurons to another may be achieved through the network of the synapse array SYNARR (or simply "synapses"), as illustrated in FIG. 2. Relative to the synapses SYNARR, the neurons of the first level LV1 may be considered presynaptic neurons and the neurons of the second level LV2 may be considered postsynaptic neurons. The synapses SYNARR may receive output signals (e.g., spikes) from the neurons of the first level LV1 and scale those signals according to adjustable synaptic weights W1~WP where P is a total number of synaptic connections between the neurons of the first level LV1 and the second level LV2. The scaled signals may be combined as an input signal of each neuron in the second level LV2. Every neuron in the second level LV2 may generate output spikes Y1~YM based on the corresponding combined input signal. The output spikes Y1~YM may be transferred to another level of neurons using another network of synapses (not shown).

The spiking neural network may be emulated by processing circuitry, for example, a general purpose processor, a digital signal processor (DSP), an application specific integrated circuit (ASIC), a field programmable gate array (FPGA) or other programmable logic device (PLD), discrete gate or transistor logic, discrete hardware components, a software module executed by a processor, or any combination thereof. The spiking neural network may be utilized in a large range of applications, such as image and pattern recognition, machine learning, motor control, etc. as will be described below with reference to FIGS. 21 and 22. Each neuron in the spiking neural network may be implemented as a neuron circuit. The neuron membrane charged to the threshold value initiating the output spike may be implemented, for example, as a capacitor that integrates an electrical current flowing through it, and a smaller memristor element may replace the capacitor.

Functionality of a neural processor that emulates the spiking neural network may depend on weights of synaptic connections, which may control strengths of connections between neurons. The synaptic weights may be stored in a nonvolatile memory in order to preserve functionality of the neural processor after being powered down.

FIG. 3 illustrates an example of an operation performed by one node, that is, one neuron ND included in a spiking neural network.

When N inputs $a_1 \sim a_n$ are provided to the node ND, the node ND may multiply the n inputs $a_1 \sim a_n$ and corresponding n weights $w_1 \sim w_n$, respectively, may sums n values obtained by the multiplication, may add an offset "b" to a summed value, and may generate one output value by applying a value to which the offset "b" is added to a specific function "σ".

As illustrated in FIG. 3, a neuron ND may receive multiple input signals, which may be signals external to the neural system, or signals generated by other neurons of the same neural system, or both. The input signal may be a current, a conductance, a voltage, a real-valued, and/or a complex-valued. The input signal may comprise a numerical value with a fixed-point or a floating-point representation. These input signals may be delivered to the neuron through synaptic connections that scale the signals according to adjustable synaptic weights. The neuron may combine the scaled input signals and use the combined scaled inputs to generate an output signal.

In a spiking neural network, a neuron ND may be implemented with processing circuitry, for example, as an analog circuit, a digital circuit or a combination-circuit including analog and digital components.

During the course of training a spiking neural network, synaptic weights (e.g., the weights W1~WP in FIG. 2 or the weights $w_1 \sim w_n$ in FIG. 3) may be initialized with random values and increased or decreased according to a learning rule. Those skilled in the art will appreciate that examples of the learning rule include, but are not limited to the spike-timing-dependent plasticity (STDP) learning rule, the Hebb rule, the Oja rule, the Bienenstock-Copper-Munro (BCM) rule, etc.

STDP is a learning process that adjusts the strength of synaptic connections between neurons. The connection strengths are adjusted based on the relative timing of a particular neuron's output and received input spikes (e.g., action potentials). Under the STDP process, long-term potentiation (LTP) may occur if an input spike to a certain neuron tends, on average, to occur immediately before that neuron's output spike. Then, that particular input is made somewhat stronger. On the other hand, long-term depression (LTD) may occur if an input spike tends, on average, to occur immediately after an output spike. Then, that particular input is made somewhat weaker, and hence the name "spike-timing-dependent plasticity." Consequently, inputs that might be the cause of the postsynaptic neuron's excitation are made even more likely to contribute in the future, whereas inputs that are not the cause of the postsynaptic spike are made less likely to contribute in the future.

The STDP learning rule may be effectively adapted to a synaptic weight of a synapse connecting a presynaptic neuron to a postsynaptic neuron as a function of time difference between spike time t_PRE of the presynaptic neuron and spike time t_POST of the postsynaptic neuron (e.g., t=t_POST−t_PRE). A typical formulation of the STDP is to increase the synaptic weight (e.g., potentiate the synapse) if the time difference is positive (the presynaptic neuron fires before the postsynaptic neuron), and decrease the synaptic weight (e.g., depress the synapse) if the time difference is negative (the postsynaptic neuron fires before the presynaptic neuron).

In the STDP process, a change of the synaptic weight over time may be typically achieved using an exponential decay.

FIG. 4 illustrates an example diagram of a synaptic weight change as a function of relative timing of presynaptic and postsynaptic spikes in accordance with the STDP. If a presynaptic neuron fires before a postsynaptic neuron, then a corresponding synaptic weight may be increased, as illustrated in a portion GP1 of the graph. This weight increase can be referred to as an LTP of the synapse. It can be observed from the graph portion GP1 that the amount of LTP may decrease roughly exponentially as a function of the difference between presynaptic and postsynaptic spike times. The reverse order of firing may reduce the synaptic weight, as illustrated in a portion GP2 of the graph, causing an LTD of the synapse. A point PX of cross-over of the x-axis (y=0) may be configured to coincide with the maximum time lag for considering correlation for causal inputs from layer.

Figure 5:
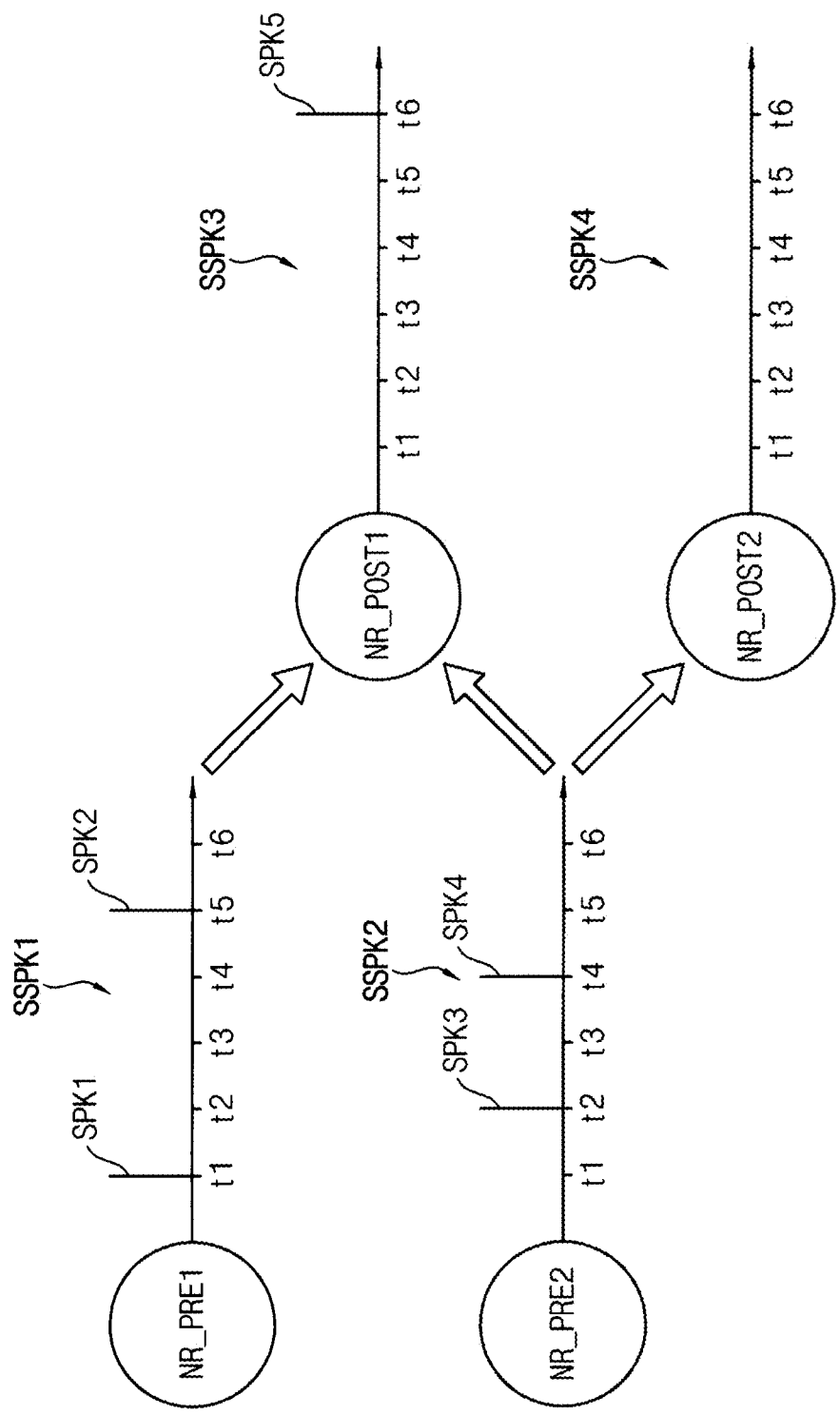
FIG. 5 is a diagram for describing spike signals output from neurons.

FIG. 5 is a diagram for describing spike signals output from neurons.

Referring to FIG. 5, a first presynaptic neuron NR_PRE1, a second presynaptic neuron NR_PRE2, a first postsynaptic neuron NR_POST1 and a second postsynaptic neuron NR_POST2 may generate spike signals SSPK1~SSPK4, respectively. When the spike signal SSPK1 including spikes SPK1 and SPK2 and the spike signal SSPK2 including spikes SPK3 and SPK4 are input to the first postsynaptic neuron NR_POST1, the first postsynaptic neuron NR_POST1 may output the spike signal SSPK3 including a spike SPK5. In contrast, the second postsynaptic neuron NR_POST2 receiving only the spike signal SSPK2 may output the spike signal SSPK4 that includes no spike.

As illustrated in FIG. 5, the first presynaptic neuron NR_PRE1 may generate the spikes SPK1 and SPK2 at time points t1 and t5, the second presynaptic neuron NR_PRE2 may generate the spikes SPK3 and SPK4 at time points t2 and t4, and the first postsynaptic neuron NR_POST1 may generate the spike SPK5 at a time point t6. Such time points of the generated spikes may be included, as timing information, in the above-described information on the transmission spikes and the reception spikes.

Figure 6:
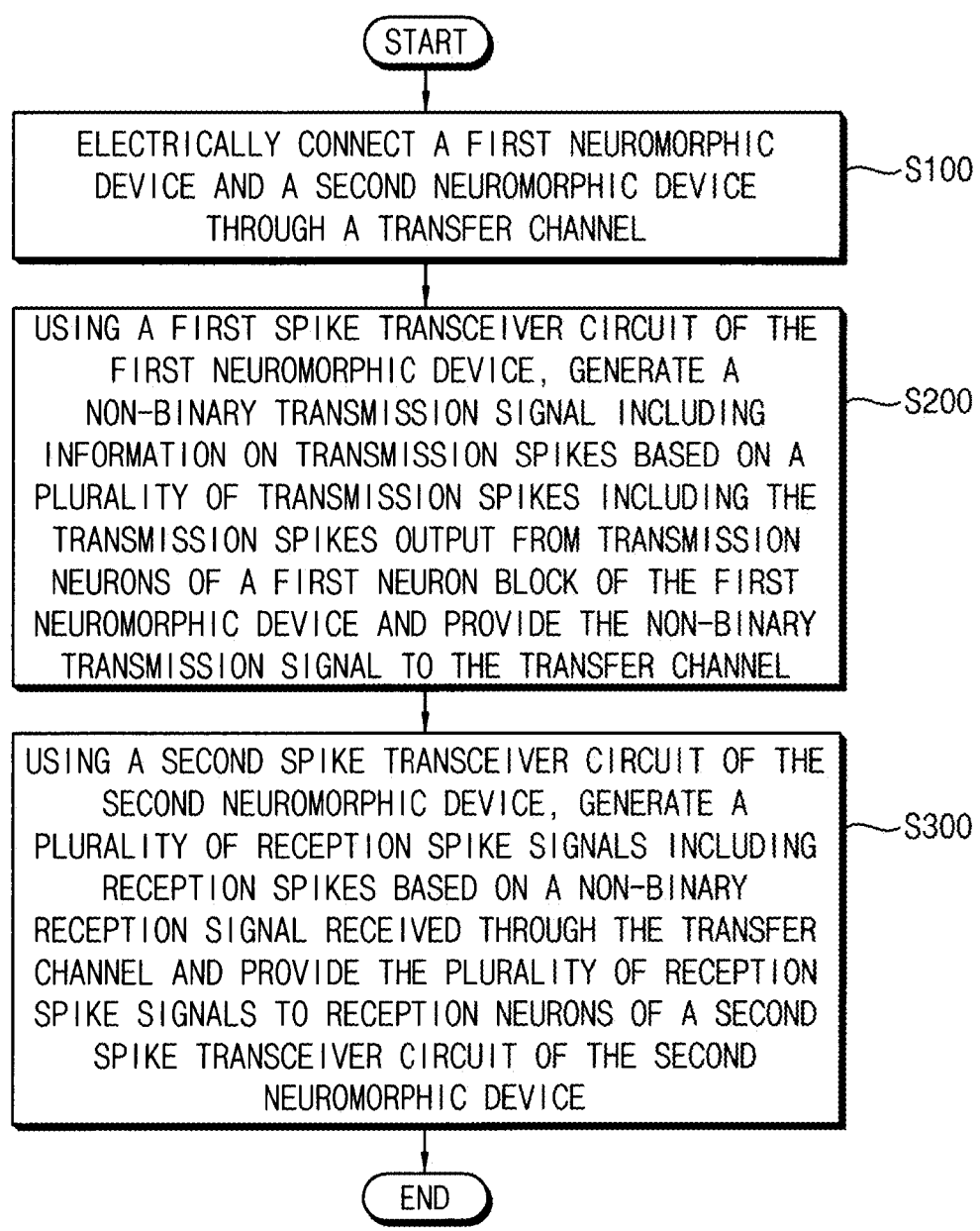
FIGS. 6 and 7 are diagrams for describing a method of implementing a spiking neural network according to example embodiments.
Figure 7:
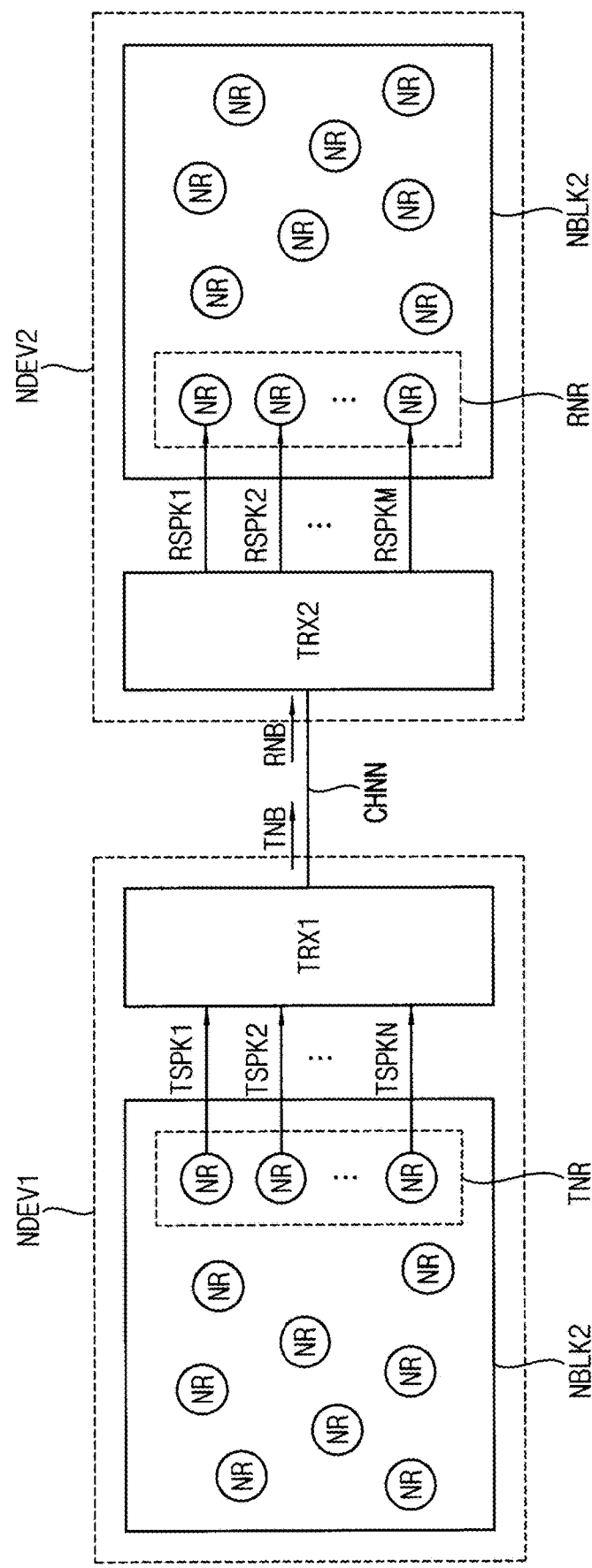

FIGS. 6 and 7 are diagrams for describing a method of implementing a spiking neural network according to example embodiments.

Referring to FIGS. 6 and 7, a first neuromorphic device NDEV1 and a second neuromorphic device NDEV2 may be electrically connected through a transfer channel CHNN (S100).

Using a first spike transceiver circuit TRX1 of the first neuromorphic device NDEV1, a non-binary transmission signal TNB including information on transmission spikes is generated based on a plurality of transmission spikes TSPK1~TSPKN including the transmission spikes output from transmission neurons TNR of a first neuron block NBLK1 of the first neuromorphic device NDEV1 and the non-binary transmission signal TNB is provided to the transfer channel CHNN (S200).

Using a second spike transceiver circuit TRX2 of the second neuromorphic device NDEV2, a plurality of reception spike signals RSPK1~RSPKM including reception spikes are generated based on a non-binary reception signal RNB received through the transfer channel CHNN and the plurality of reception spike signals RSPK1~RSPKM are provided to reception neurons RNR of a second spike transceiver circuit TRX2 of the second neuromorphic device NDEV2 (S300).

As such, a spiking neural network may be implemented by combining a plurality of neuromorphic devices. The spiking neural network may be implemented more efficiently through conversion of spike signals and non-binary signals between the plurality of neuromorphic devices.

Figure 8:
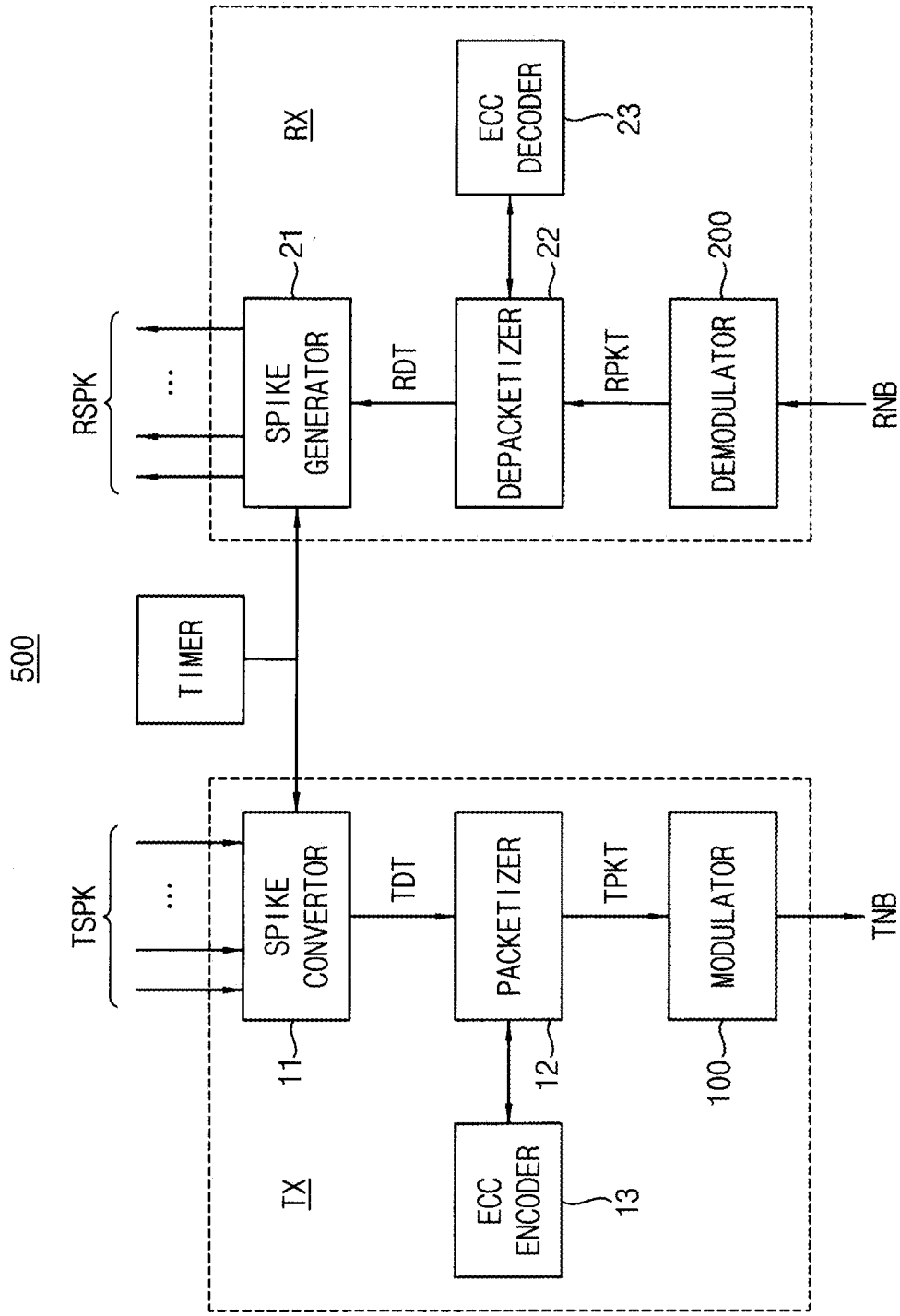
FIG. 8 is a block diagram illustrating a spike transceiver circuit included in a neuromorphic device according to example embodiments.

FIG. 8 is a block diagram illustrating a spike transceiver circuit included in a neuromorphic device according to example embodiments.

Referring to FIG. 8, a spike transceiver circuit 500 may include a spike transmission circuit TX and/or a spike reception circuit RX.

The spike transmission circuit TX may include a spike converter 11, a packetizer 12, a modulator 100 and/or an ECC encoder 13.

The spike converter 11 may generate transmission spike data TDT including timing information of transmission spikes TSPK referring to a reference time provided from a timer. The packetizer 12 may generate a transmission packet TPKT based on the transmission spike data TDT. The modulator 100 may modulate the transmission packet TPKT to generate a non-binary transmission signal TNB. The ECC encoder 13 may generate parity bits by performing ECC encoding with respect to at least one of a header or a payload of the transmission packet TPKT, and the packetizer 12 may add the parity bits to the transmission packet TPKT.

The spike reception circuit RX may include a demodulator 200, a depacketizer 22, a spike generator 21 and/or an ECC decoder 23.

The demodulator 200 may demodulate a non-binary reception signal RNB to generate a reception packet RPKT. The depacketizer 22 may generate, based on the reception packet RPKT, reception spike data RDT including timing information of reception spikes. The spike generator 21 may generate a plurality of reception spike signals RSPK based on the reception spike data RDT referring to the reference time provided from the timer. The ECC decoder 23 may correct errors in the reception packet RPKT based on parity bits included in the reception packet RPKT.

In some example embodiments, the ECC encoder 13 and the ECC decoder 23 may be implemented to share at least a portion of components. In some example embodiments, the ECC encoder 13 and the ECC decoder 23 may be enable selectively or the ECC encoder 13 and the ECC decoder 23 may be omitted. The timer may be included in a neuromorphic device including the spike transceiver circuit 500 to provide the reference time for synchronizing overall operations of the neuromorphic device.

As such, the spike transmission circuit TX may generate the transmission packet TPKT based on the information on the transmission spikes and modulate the transmission packet TPKT into the non-binary transmission signal TNB, whereas the spike reception circuit RX may demodulate the non-binary reception signal RNB into the reception packet RPKT. The spiking neural network may be implemented efficiently through packetizing of the spike signals and modulating the packet into the non-binary signal.

FIGS. 9A through 9G are diagrams illustrating example formats of a packet, storable in a memory, used in a neuromorphic device according to example embodiments.

Referring to FIGS. 9A through 9G, a packet may include a header HDR and a payload. The packet may be the above-described transmission packet output from the spike transmission circuit and the above-described reception packet input to the spike reception circuit. The header HDR may include information such as an identifier PSRC of the transmission neuron block generating spikes SPK1~SPK3, an identifier PDST of the reception neuron block or the spike reception circuit receiving the packet, the number NS of spikes SPK1~SPK3 included in the packet, etc. Even though not illustrated in figures, the header HDR may further include information on whether to enable an ECC function, an ECC coding scheme, etc.

Figure 9A:
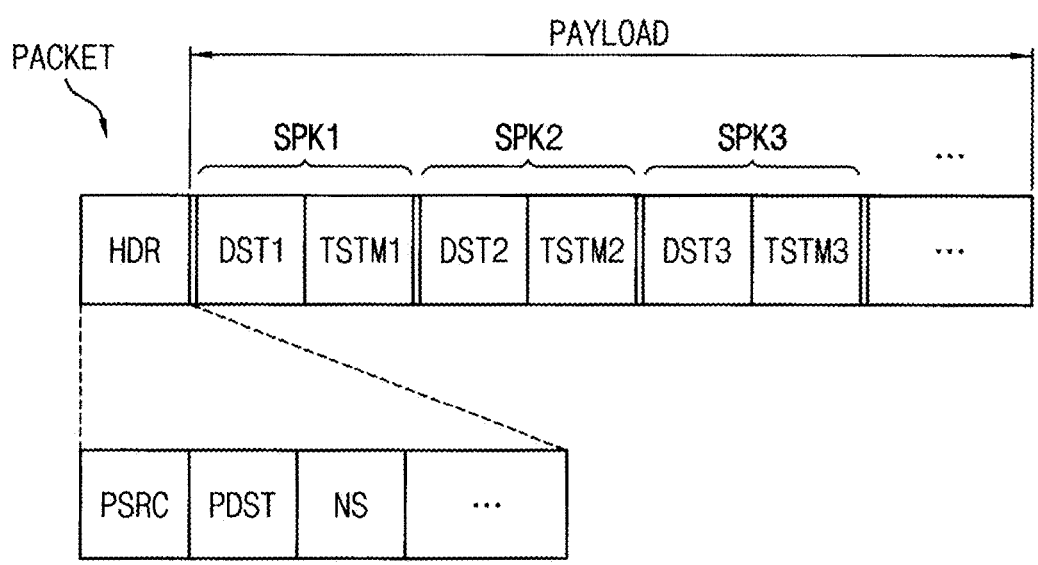
FIGS. 9A through 9G are diagrams illustrating example formats of a packet used in a neuromorphic device according to example embodiments.

In some example embodiments, as illustrated in FIG. 9A, the payload may include identifiers DST1~DST3 of reception neurons to receive the transmission spikes SPK1~SPK3 and timing information of the transmission spikes SPK1~SPK3 such as time stamps TSTM1~TSTM3.

Figure 9B:
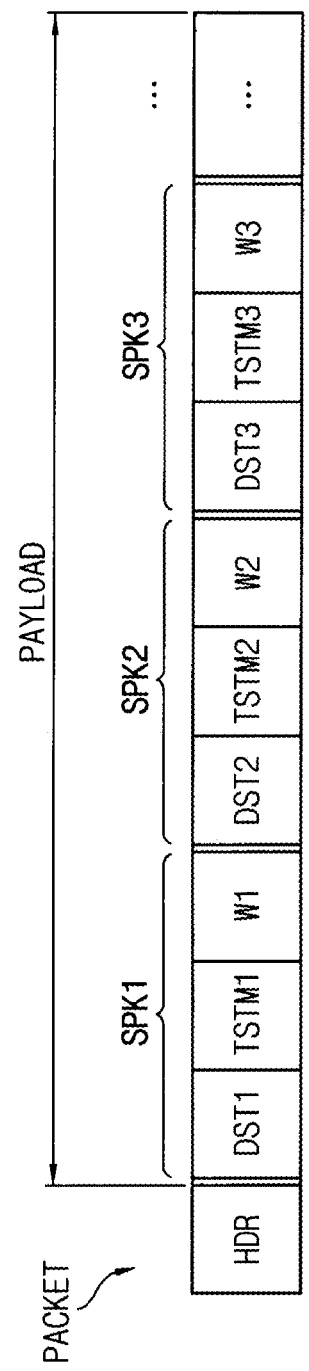

In some example embodiments, as illustrated in FIG. 9B, the payload may include identifiers DST1~DST3 of reception neurons to receive the transmission spikes SPK1~SPK3, timing information of the transmission spikes SPK1~SPK3 the such as time stamps TSTM1~TSTM3, and weight values W1~W3.

Figure 9C:
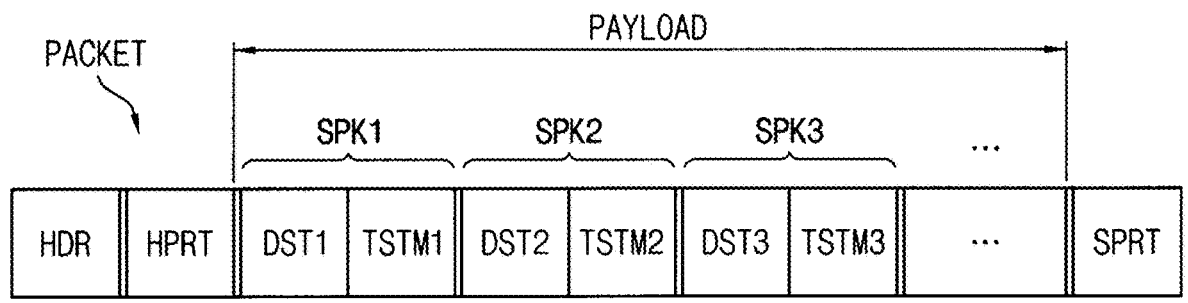

In some example embodiments, as illustrated in FIG. 9C, the spike transmission circuit may generate header parity bits HPRT by performing ECC encoding with respect to the header HDR and add the header parity bits HPRT to the transmission packet. In addition, the spike transmission circuit may generate spike parity bits SPRT by performing ECC encoding with respect to the payload and add the spike parity bits SPRT to the transmission packet. The spike reception circuit may correct errors in the reception packet based on the parity bits HPRT and SPRT included in the reception packet.

Figure 9D:
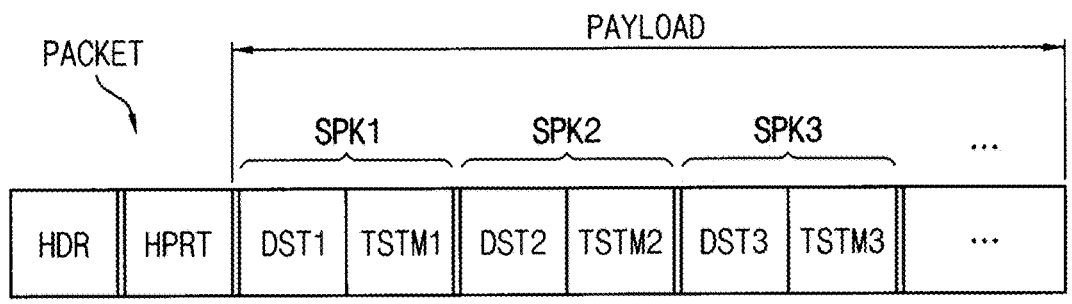

According to example embodiments, as illustrated in FIG. 9D, the spike transmission circuit may perform the ECC encoding with respect to only the header HDR to add the header parity bits HPRT to the transmission packet, and the ECC encoding of the payload may be omitted.

Figure 9E:
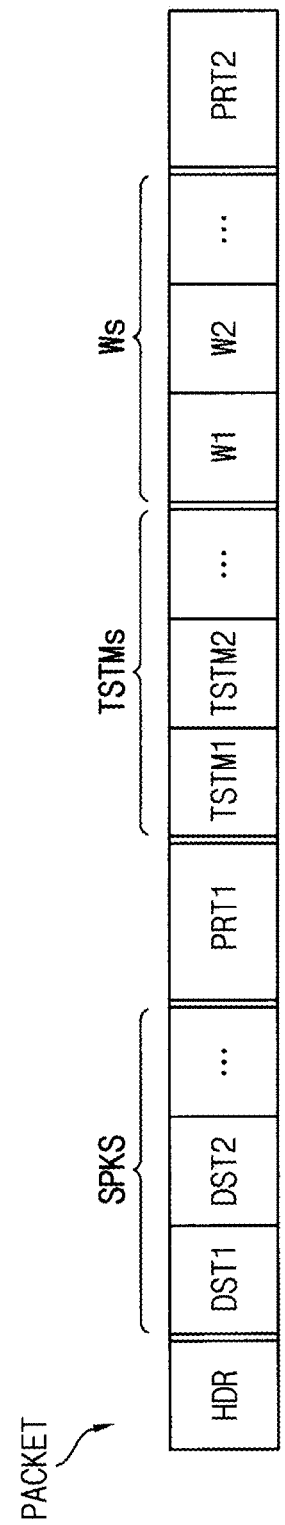

In some example embodiments, as illustrated in FIG. 9E, the spike transmission circuit may generate first parity bits PRT1 by performing ECC encoding with respect to the header HDR and the identifiers DST1~DST3 of the reception neurons and add the first parity bits PRT1 to the transmission packet. In addition, the spike transmission circuit may generate second parity bits PRT2 by performing ECC encoding with respect to the time stamps TSTM1~TSTM3 and weight values W1~W3 and add the second parity bits PRT2 to the transmission packet. In some embodiments, the ECC level of the first parity bits PRT1 may be higher than the ECC level of the second parity bits PRT2. The ECC level will be described below with reference to FIG. 10.

Figure 9F:
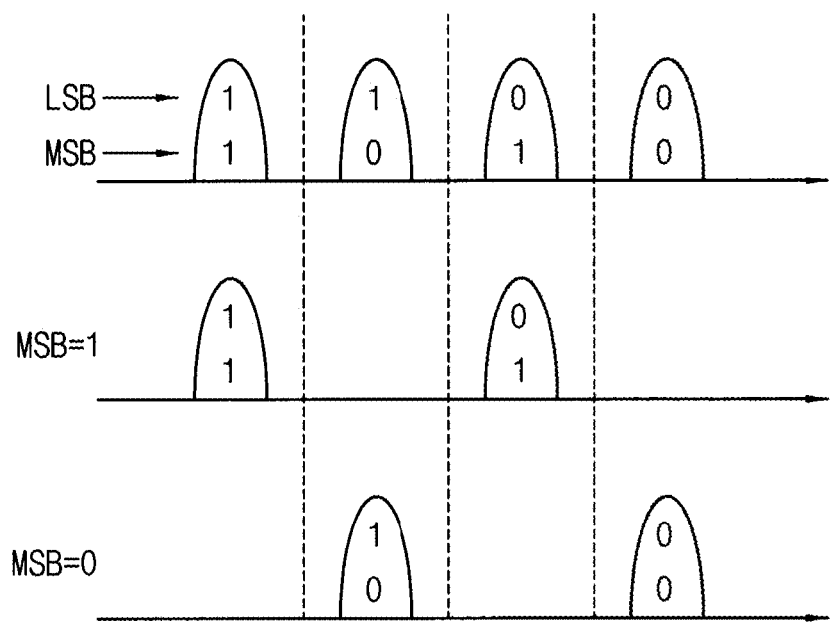
Figure 9G:
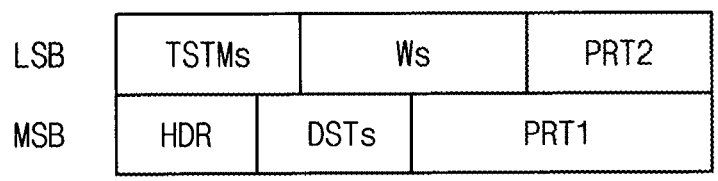

FIGS. 9F and 9G illustrate some example embodiments of multi-level coding corresponding to a transfer scheme using PAM4 signal.

As illustrated in FIG. 9F, the four signal levels of the PAM4 signal may correspond to values '11', '10', '01' and '10' of 2-bit data. The values '11' and '10' indicate some example embodiments that most significant bit (MSB) is 1, and the values '01' and '00' indicate some example embodiments that the MSB is 1.

As illustrated in 9G, in the PAM4 transfer scheme, the header HDR and the identifiers DSTs of the reception neurons may be disposed at the MSBs of the packet, and the time stamps TSTMs and weight values Ws may be disposed at the least significant bits (LSBs) of the packet. The spike transmission circuit may generate first parity bits PRT1 by performing ECC encoding with respect to the header HDR and the identifiers DSTs and add the first parity bits to the MSBs of the packet. In addition, the spike transmission circuit may generate second parity bits PRT2 by performing ECC encoding with respect to the time stamps TSTMs and the weight values Ws and add the first parity bits to the LSBs of the packet. In some example embodiments, the ECC level of the first parity bits PRT1 may be set to be higher than the ECC level of the second parity bits PRT2.

As such, the code rate may be increased and/or the ECC overhead may be relieved by applying the different ECC levels depending on the importance of the transferred information.

FIG. 10 is a diagram for describing error correction code (ECC) levels in a neuromorphic device according to example embodiments.

In FIG. 10, SEC represents single error correction, DED represents double error detection and DEC represents double error correction. FIG. 10 illustrates numbers of parity bits corresponding to a Hamming code or an extended Hamming code. The example embodiments in FIG. 10 are non-limiting examples and example embodiments are not limited thereto. For example, the parity bit number may be determined differently if contained in a Bose-Chaudhuri-Hocquenghem (BCH) code, Reed-Solomon code, etc.

The error correction degree and the performance of the system may be adjusted by selecting the proper ECC levels among a plurality of ECC levels as illustrated in FIG. 10. As the number of neurons included in the spiking neural network is increased, demands on data transfer of higher capacity and/or higher speed may be increased. The operation speed of the neuromorphic device and the neuromorphic system may be increased by transferring the information on the spikes using the PAM scheme as will be described below with reference to FIGS. 11 through 15.

Figure 11:
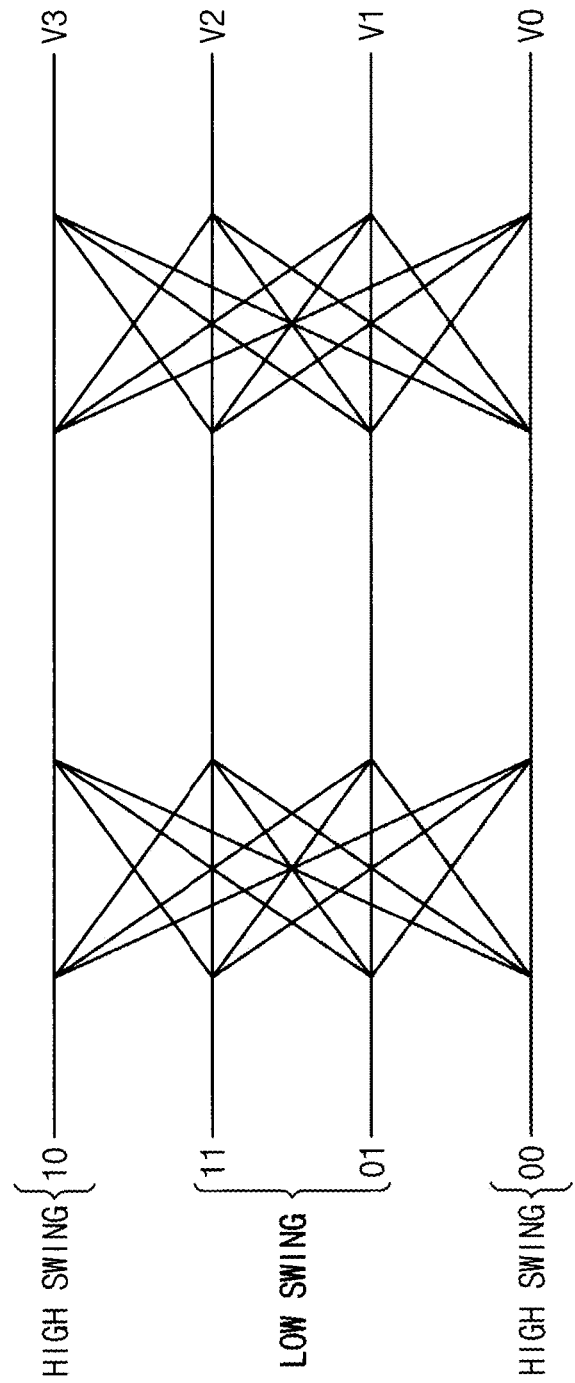
FIG. 11 is a diagram illustrating an example of a pulse amplitude modulation (PAM) signal in a neuromorphic device according to example embodiments.

FIG. 11 is a diagram illustrating an example of a pulse amplitude modulation (PAM) signal in a neuromorphic device according to example embodiments.

Referring to FIG. 11, a PAM4 signal having four signal levels may be generated in a PAM transmitter. The lowest voltage level V0 of the PAM4 signal may be mapped onto 2-bit data of "00". The highest voltage level V3 of the PAM4 signal may be mapped onto 2-bit data of "10". The lowest voltage level V0 and the highest voltage level V3 of the PAM4 signal correspond to a high swing level. The middle voltage levels V1 and V2 of the PAM4 signal may be mapped onto 2-bit data of "01" and "11", respectively. Each of the middle voltage levels V1 and V2 corresponding to 2-bit data of "01" and "11" may correspond to a low swing level. Mapping between the above-described voltage levels V0, V1, V2, and V3 and data may be gray code-based mapping. However, mapping between illustrated voltage levels and data bits shown in FIG. 11 is an example, and it may be understood that the mapping may be changed variously.

In the PAM4 transmitter described below, a driver to generate a signal of a low swing level and a driver to generate a signal of a high swing level may be separately provided. In addition, it may be understood that there may be provided three or more drivers capable of driving a plurality of voltage swings, as well as a low swing and a high swing, in a pulse amplitude modulation scheme.

Figure 12:
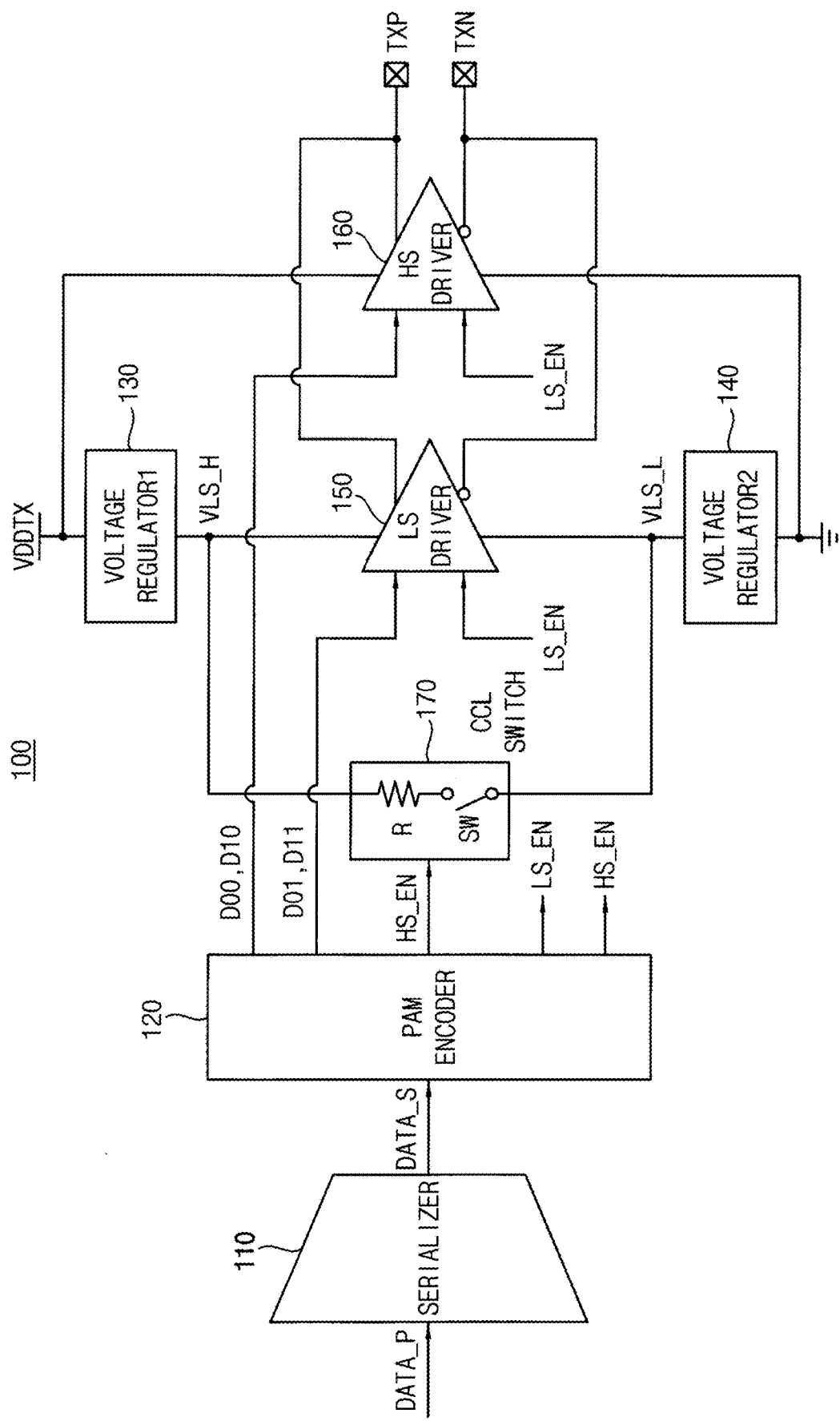
FIG. 12 is a block diagram illustrating an example embodiment of a modulator included in a neuromorphic device according to example embodiments.

FIG. 12 is a block diagram illustrating an example embodiment of a modulator included in a neuromorphic device according to example embodiments.

Referring to FIG. 12, the modulator may be implemented as a PAM transmitter 100. The PAM transmitter 100 may include a serializer 110, a PAM encoder 120, a first voltage regulator 130, a second voltage regulator 140, a low swing driver 150, a high swing driver 160, and/or a constant current load switch 170.

The serializer 110 converts data Data_P to be transmitted to serial data Data_S of the form of continuous data streams. In example embodiments, the data Data_P may be provided from processing circuitry, for example, a processor or baseband units such as various data processing blocks. The serial data Data_S may be output in the form of continuous binary bits by the serializer 110.

The PAM encoder 120 encodes the data Data_S in a 2-bit unit. For example, The PAM encoder 120 divides continuous data Data_S into 2-bit units. The PAM encoder 120 generates a driving signal D00, D01, D11, or D10 corresponding to a logical value of each 2-bit unit. The PAM encoder 120 transfers the generated driving signal to low swing driver 150 or high swing driver 160. For example, in some example embodiments where a logical value of 2-bit data is "00" or "10", the PAM encoder 120 transfers the driving signal "D00" or "D10" to high swing driver 160. In some example embodiments where a logical value of 2-bit data is "01" or "11", the PAM encoder 120 transfers the driving signal "D01" or "D11" to low swing driver 150.

In addition, in some example embodiments where the PAM encoder 120 transfers the driving signal "D01" or "D11" to low swing driver 150, the PAM encoder 120 may generate a first enable signal LS_EN for activating the low swing driver 150. In some embodiments where the PAM encoder 120 transfers the driving signal "D00" or "D10" to the high swing driver 160, the PAM encoder 120 may generate a second enable signal HS_EN for activating the high swing driver 160.

The PAM encoder 120 may turn on the constant current load switch 170 when the high swing driver 160 is activated and the low swing driver 150 is deactivated. In some example embodiments where the PAM encoder 120 transfers the driving signal "D00" or "D10" to the high swing driver 160, the PAM encoder 120 may deactivate the low swing driver 150 and, simultaneously, may turn on the constant current load switch 170. If the constant current load switch 170 is turned on, a current path between the voltage regulators 130 and 140 is formed. In some example embodiments, even though a current path passing through the low swing driver 150 is blocked, the voltage regulators 130 and 140 may maintain a stable operation because a current path is formed through the constant current load switch 170. To control the constant current load switch 170, for example, the PAM encoder 120 may use the second enable signal HS_EN. However, it should be understood that the first enable signal LS_EN, may be used to turn on or off the constant current load switch 170 in some example embodiments.

The first voltage regulator 130 provides a first low swing voltage VLS_H to the low swing driver 150. The first voltage regulator 130 may be configured to output the first low swing voltage VLS_H corresponding to an optimum high signal level depending on a reference voltage Vref (not shown in FIG. 12). The first voltage regulator 130 continuously generates the first low swing voltage VLS_H and provides the first low swing voltage VLS_H to the low swing driver 150. That is, the first voltage regulator 130 may continuously maintain an enable state even while the low swing driver 150 does not generate a signal.

The second voltage regulator 140 provides a second low swing voltage VLS_L to the low swing driver 150. The second voltage regulator 140 may be configured to output the second low swing voltage VLS_L corresponding to an optimum low signal level depending on the reference voltage Vref. The second voltage regulator 140 continuously generates the second low swing voltage VLS_L and provides the second low swing voltage VLS_L to the low swing driver 150. That is, the second voltage regulator 140 may continuously maintain an enable state even while the low swing driver 150 does not generate a signal.

The low swing driver 150 generates a low swing signal corresponding to the driving signal "D01" or "D11" (the case where a logical value of 2-bit data is "01" or "11"). The low swing driver 150 generates a low swing signal having a low swing level (e.g., V1 and V2 of FIG. 1) by using the first and second low swing voltages VLS_H and VLS_L provided from the voltage regulators 130 and 140. The low swing driver 150 generates a low swing signal in response to the first enable signal LS_EN from the PAM encoder 120. The low swing driver 150 may transfer the generated low swing signal to the output terminals TXP and TXN.

The high swing driver 160 generates a high swing signal corresponding to the driving signal "D00" or "D10" (the case where a logical value of 2-bit data is "00" or "10"). The high swing driver 160 generates a high swing signal of a high swing level (e.g., V0 and V3 of FIG. 1) by using transmission power supply voltages VDDTX and VSS (e.g., a ground voltage). The high swing driver 160 generates a high swing signal in response to the second enable signal HS_EN from the PAM encoder 120. The high swing driver 160 may transfer the generated high swing signal to the output terminals TXP and TXN.

The low swing signal and the high swing signal are mutually exclusively transferred to the output terminals TXP and TXN. For example, the high swing signal may not exist at a point in time when the low swing signal is output. That is, at a point in time when the low swing driver 150 outputs the low swing signal, the high swing driver 160 may be deactivated, and the output terminals of the high swing driver 160 may maintain a high-impedance state, and vice versa. At a point in time when the high swing driver 160 outputs the high swing signal, the low swing driver 150 may be deactivated, and the output terminals of the low swing driver 150 may maintain a high-impedance state.

The constant current load switch 170 provides a current path between the first voltage regulator 130 and the second voltage regulator 140 under control of the PAM encoder 120. While the low swing driver 150 is activated, the low swing driver 150 provides a current path between the first voltage regulator 130 and the second voltage regulator 140. However, a current path formed within the low swing driver 150 is blocked while the low swing driver 150 is deactivated.

Figure 13:
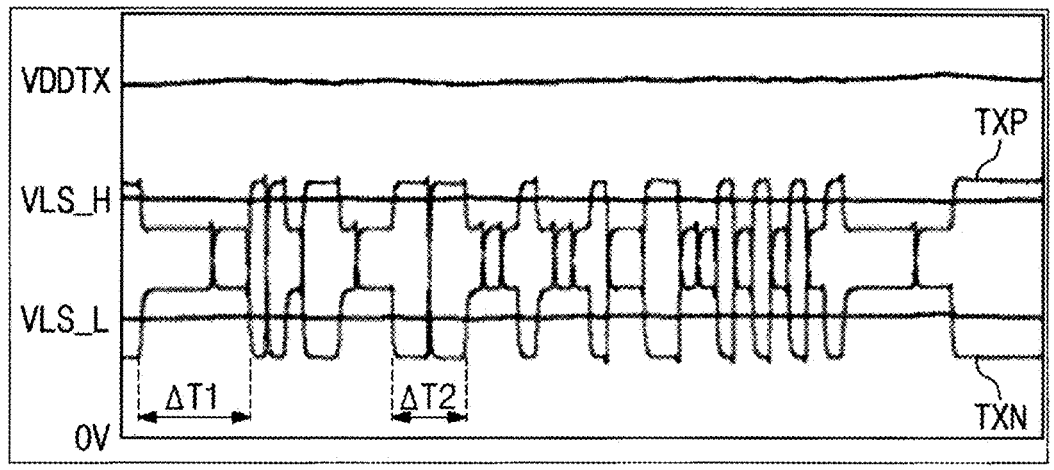
FIG. 13 is a timing diagram illustrating an example of a PAM signal output from the modulator of FIG. 12.

FIG. 13 is a timing diagram illustrating an example of a PAM signal output from the modulator of FIG. 12.

Referring to FIG. 13, at levels of the transmission power supply voltages VDDTX and "0V", the PAM transmitter 100 continuously performs high swing and low swing operations to generate a PAM transmit signal.

The low swing operation is made between the first low swing voltage VLS_H that the first voltage regulator 130 provides and the second low swing voltage VLS_L that the second voltage regulator 140 provides. If the high swing driver 160 is deactivated and the low swing driver 150 is activated, a PAM transmit signal of the output terminals TXP and TXN swings between a level of the first low swing voltage VLS_H and a level of the second low swing voltage VLS_L. In some example embodiments, in a period ΔT1 where the low swing enable signal LS_EN is activated, the low swing driver 150 may generate the PAM transmit signal by using the first low swing voltage VLS_H and the second low swing voltage VLS_L. Accordingly, the PAM transmit signal swings between the first low swing voltage VLS_H and the second low swing voltage VLS_L at a point in time when the low swing enable signal LS_EN is activated.

In contrast, low the swing driver 150 is deactivated in a period ΔT2 where the high swing enable signal HS_EN is activated. In some example embodiments, the high swing driver 160 may generate the PAM transmit signal by using the transmission power supply voltages VDDTX and VSS. Accordingly, the PAM transmit signal swings between a level greater than the first low swing voltage VLS_H and a level less than the second low swing voltage VLS_L.

Figure 14:
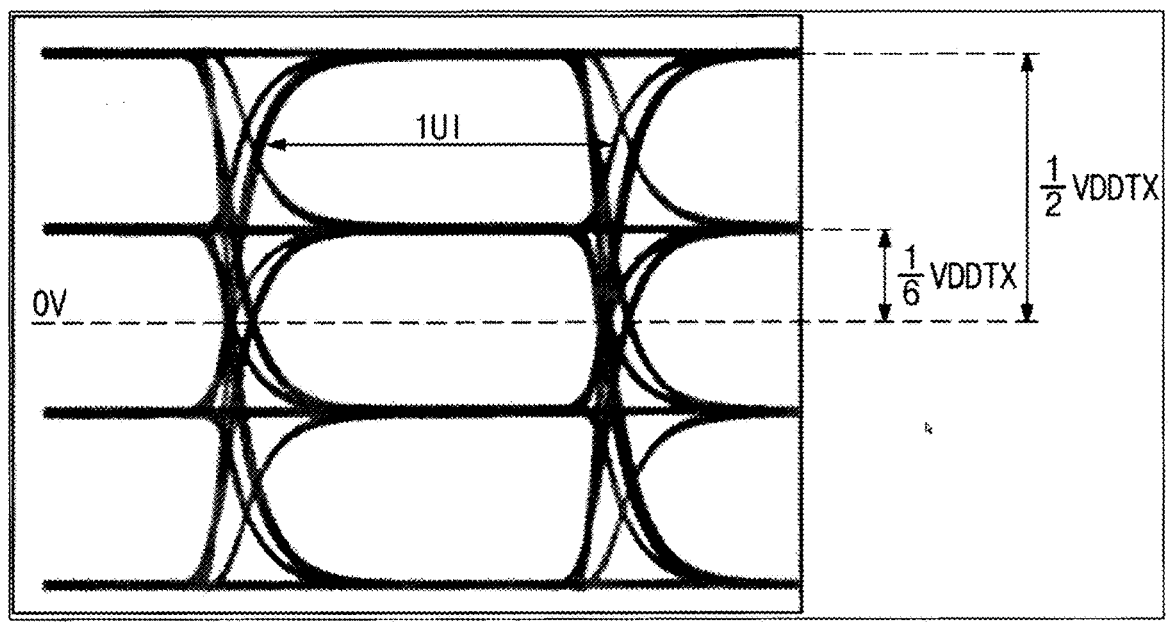
FIG. 14 is a diagram illustrating an example eye pattern of a PAM signal.

FIG. 14 is a diagram illustrating an example eye pattern of a PAM signal.

Referring to FIG. 14, an eye pattern of a PAM transmit signal provides a characteristic of an eye pattern in a typical PAM4 signal scheme by an efficient voltage swing of low swing driver 150 and high swing driver 160.

As illustrated in FIG. 7, an output transmit signal of a PAM4 signaling scheme may support four levels and may transmit 2-bit data per unit interval (UI).

Figure 15:
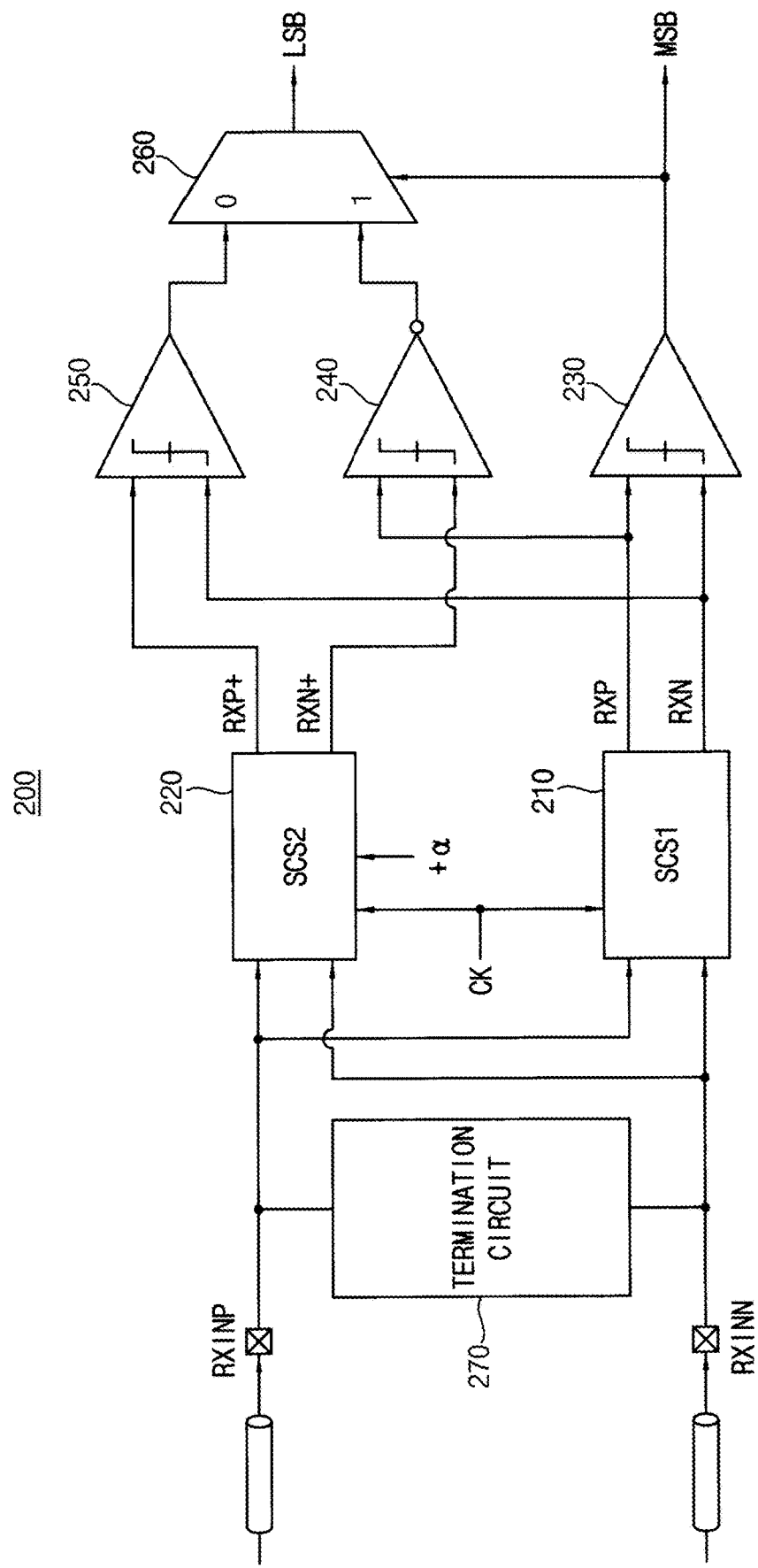
FIG. 15 is a block diagram illustrating an example embodiment of a demodulator included in a neuromorphic device according to example embodiments.

FIG. 15 is a block diagram illustrating some example embodiments of a demodulator included in a neuromorphic device according to example embodiments.

Referring to FIG. 15, a PAM receiver 200 may include a first switched capacitor summer 210, a second switched capacitor summer 220, a first comparator 230, a second comparator 240, and a third comparator 250, a multiplexer 260, and/or a termination circuit 270.

The PAM input signals RXINP and RXINN transferred through transmission lines are transferred to input pads of the PAM receiver 200. The PAM input signals RXINP and RXINN are transferred to the first switched capacitor summer 210 and the second switched capacitor summer 220 after being converted to voltage signals of preset levels by the termination circuit 270.

The first switched capacitor summer 210 generates first and second receive signals RXP and RXN from the PAM input signals RXINP and RXINN. The second switched capacitor summer 220 has the same structure as the first switched capacitor summer 210 except that an offset "a" is applied thereto. The first and second receive signals RXP and RXN generated in the first switched capacitor summer 210 are transferred to corresponding inputs of the second and third comparators 240 and 250, respectively, for determining a least significant bit LSB, and are also each transferred to a corresponding input of the first comparator 230 for determining a most significant bit MSB.

The second switched capacitor summer 220 receives the PAM input signals RXINP and RXINN to generate offset receive signals RXP+ and RXN+. The second switched capacitor summer 220 generates the third and fourth receive signals RXP+ and RXN+ that are obtained by applying the offset "a" to the PAM input signals RXINP and RXINN. To apply the offset "a", the second switched capacitor summer 220 has a structure for capacitor switching and boosting of a voltage corresponding to the offset "a". The second switched capacitor summer 220 may use a clock signal CK for capacitor switching. The third and fourth receive signals RXP+ and RXN+ generated by the second switched capacitor summer 220 are provided to corresponding inputs of the second and third comparators 240 and 250 for determining the LSB.

The first comparator 230 determines a logical value of the MSB of 2-bit data transferred in one unit interval UI. The first comparator 230 determines a logical value of the MSB by using the first receive signal RXN and the second receive signal RXP to which an offset is not applied. A technique to determine a logical value of the MSB through the first comparator 230 is the same or substantially the same as a technique to determine a logical value by using levels of differential signals in a general NRZ-based receiver. The first receive signal RXN may have substantially a symmetrical relationship with the second receive signal RXP with respect to a center voltage. That is, the MSB of a 2-bit data unit transferred during one unit interval may be determined by using levels of the first receive signal RXN and the second receive signal RXP. For example, if a voltage of the second receive signal RXP is greater than an MSB reference voltage VMSB, first comparator 230 may determine the MSB of PAM reception data of a 2 bit data unit as a logic "1".

The second comparator 240 determines a first least significant bit value of the 2-bit data unit transferred in one unit interval UI by using the second receive signal RXP, to which an offset is not applied, and the third receive signal RXN+ to which an offset is applied. The third receive signal RXN+ has a voltage level boosted by the offset "a" compared with the first receive signal RXN. The second comparator 240 may compare the second receive signal RXP and the third receive signal RXN+ boosted by the offset "a" and may output an inverted bit value of the first least significant bit value actually transferred as the comparison result. Accordingly, an inverter may be connected to an output terminal of the second comparator 240 for the purpose of restoring the inverted value of the first least significant bit value. The first least significant bit value output by the second comparator 240 may be valid as the LSB output by the PAM receiver 200 when the MSB is logic "1".

The third comparator 250 determines a logical value of a second least significant bit value of a 2-bit data unit transferred in one unit interval UI by using the first receive signal RXN, to which an offset is not applied, and the fourth receive signal RXP+ to which an offset is applied. The fourth receive signal RXP+ has a voltage level boosted by the offset "α" compared with the second receive signal RXP. The third comparator 250 may compare the first receive signal RXN and the fourth receive signal RXP+ boosted by the offset "α" and may output the second least significant bit value as the comparison result. The second least significant bit value output by the third comparator 250 may be valid as the LSB output by the PAM receiver 200 when a logical value of the MSB determined by the first comparator 230 is "0".

The multiplexer 260 selects any one of outputs of the second comparator 240 and the third comparator 250, depending on a logical value of the MSB provided from the first comparator 230. In some example embodiments where a logical value of the MSB determined by the first comparator 230 is "0", the multiplexer 260 outputs as the LSB the first least significant bit value that the third comparator 250 determines. In contrast, in some example embodiments where a logical value of the MSB determined by the first comparator 230 is "1", the multiplexer 260 outputs as the LSB the second least significant bit value that the second comparator 240 determines.

The termination circuit 270 may be implemented with an impedance circuit for matching an input impedance of the PAM receiver 200. The PAM input signals RXINP and RXINN are transferred to the first and second switched capacitor summers 210 and 220 as voltage signals by the termination circuit 270.

The neuromorphic device and the neuromorphic system including a plurality of neuromorphic devices according to example embodiments may implement an efficient spiking neural network by transferring the packetized spike signals in the form of the PAM signal as described with reference to FIGS. 11 through 15.

FIGS. 16A through 16D are diagrams illustrating example embodiments of a spiking neural network according to example embodiments.

Figure 16A:
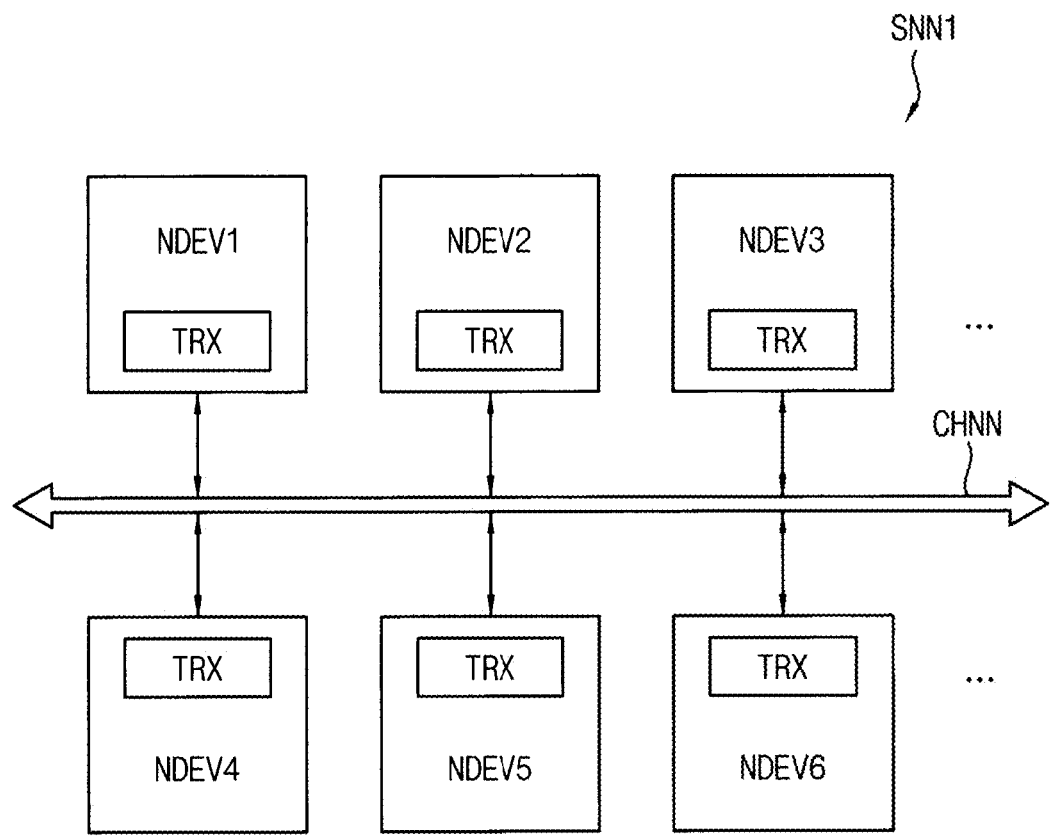
FIGS. 16A through 16D are diagrams illustrating example embodiments of a spiking neural network according to example embodiments.

Referring to FIG. 16A, a spiking neural network SNN1 may include a plurality of neuromorphic devices NDEV1~NDEV6 that are commonly connected to a transfer channel CHNN. Each of the neuromorphic devices NDEV1~NDEV6 may include a spike transceiver circuit as described above to transfer the spike information in the form of non-binary signal. In the spiking neural network SNN1 of FIG. 16A, each of the neuromorphic devices NDEV1~NDEV6 may exchange the spike information with any other neuromorphic device.

Figure 16B:
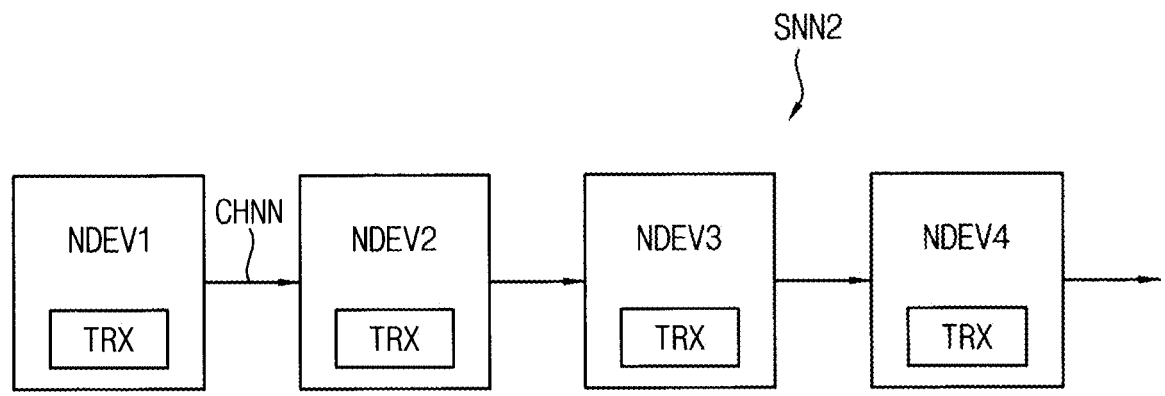
Figure 16C:
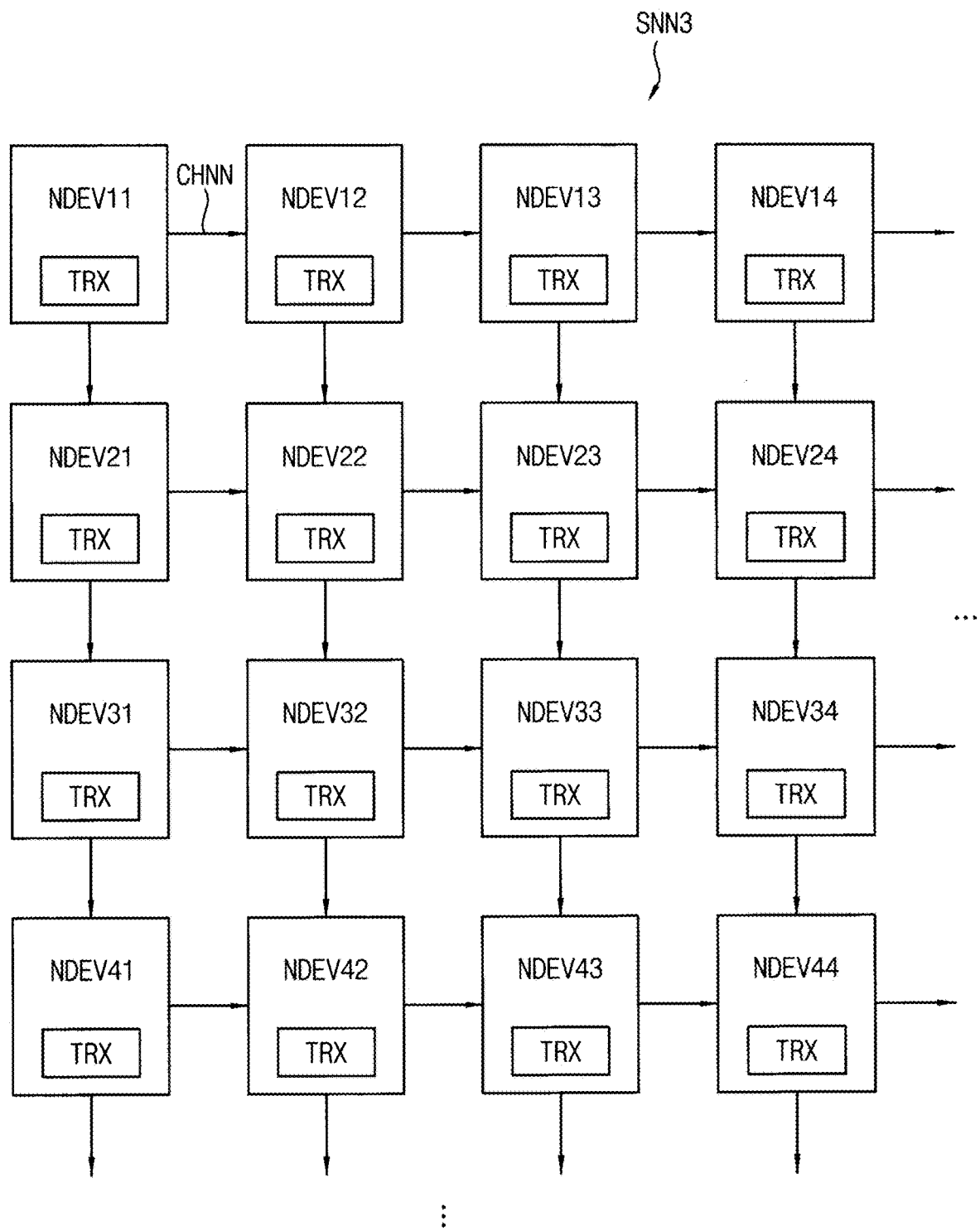
Figure 16D:
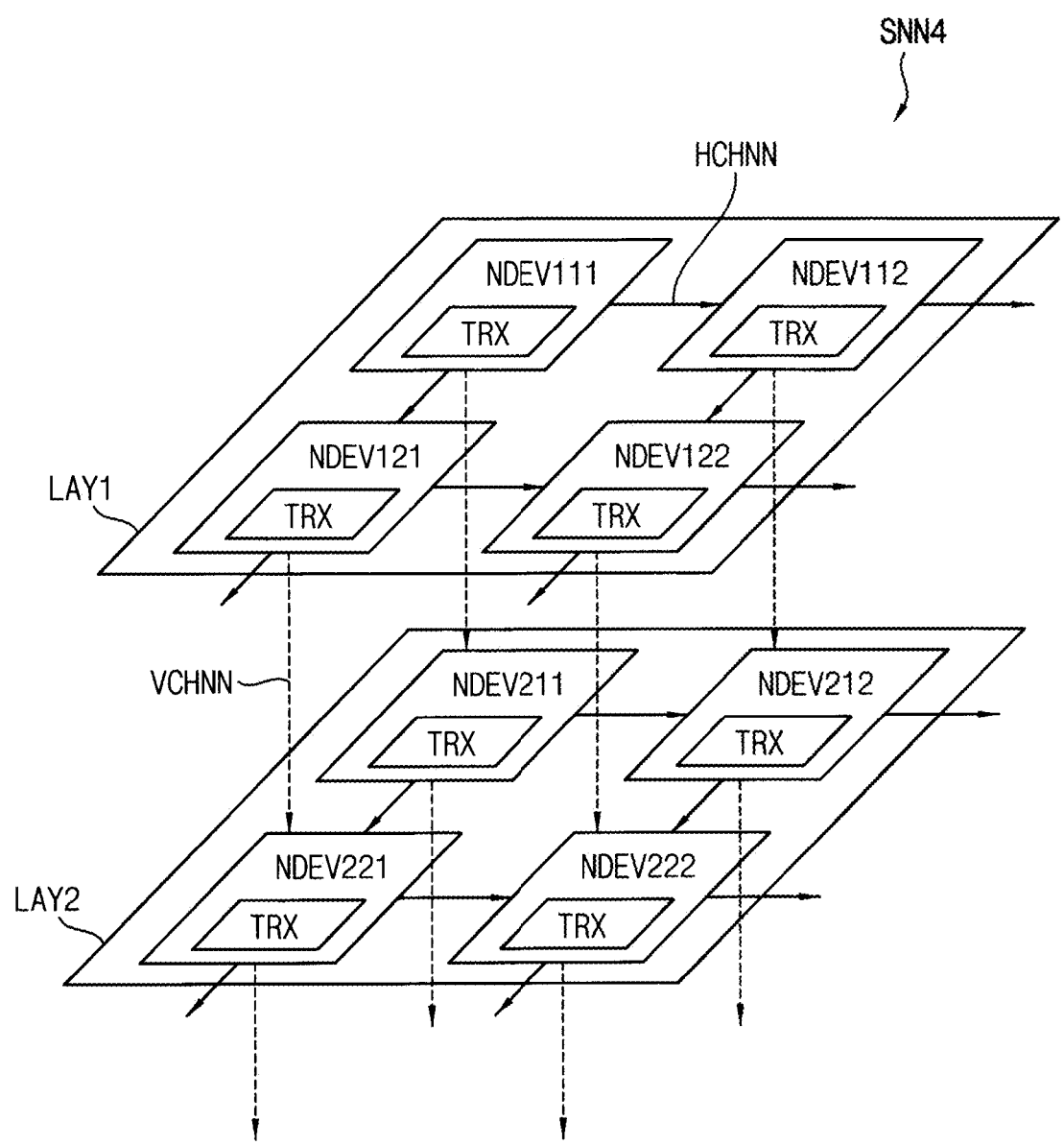

A spiking neural network SNN2 of FIG. 16B has a one-dimensional systolic configuration, a spiking neural network SNN3 of FIG. 16C has a two-dimensional systolic configuration, and a spiking neural network SNN4 of FIG. 16D has a three-dimensional systolic configuration. In the systolic configurations of FIGS. 16B, 16C and 16D, the spike transceiver circuit TRX may only the spike transmission circuit to transmit the spike information and the spike reception circuit to receive the spike information may be omitted, in some neuromorphic devices.

Referring to FIG. 16B, a plurality of neuromorphic devices NDEV1~NDEV4 may be connected through transfer channels CHNN in one dimension, and the spike information may be propagated, for example, in a right direction.

Referring to FIG. 16C, a plurality of neuromorphic devices NDEV11~NDEV44 may be connected through transfer channels CHNN in two dimensions, and the spike information may be propagated, for example, in a right direction and a bottom direction.

Referring to FIG. 16D, a plurality of neuromorphic devices NDEV111~NDEV222 may be connected through horizontal transfer channels HCHNN and vertical transfer channels VCHNN in three dimensions. In each of layers LAY1 and LAY2, the spike information may be propagated, for example, in a right direction and a bottom direction. Between the layers LAY1 and LAY2, the spike information may be propagated, for example, a downward direction (from LAY1 to LAY2).

As such, various spiking neural networks may be implemented using a plurality of neuromorphic devices. At least one of the neuromorphic devices may transmit a non-binary transmission signal to the transfer channel using the spike transmission circuit in the spike transceiver circuit TRX, and at least one of the neuromorphic devices may receive, as a non-binary reception signal, the non-binary transmission signal through the transfer channel using the spike reception circuit in the spike transceiver circuit TRX.

FIGS. 17 through 20 are diagrams illustrating a neuromorphic system according to example embodiments.

Figure 17:
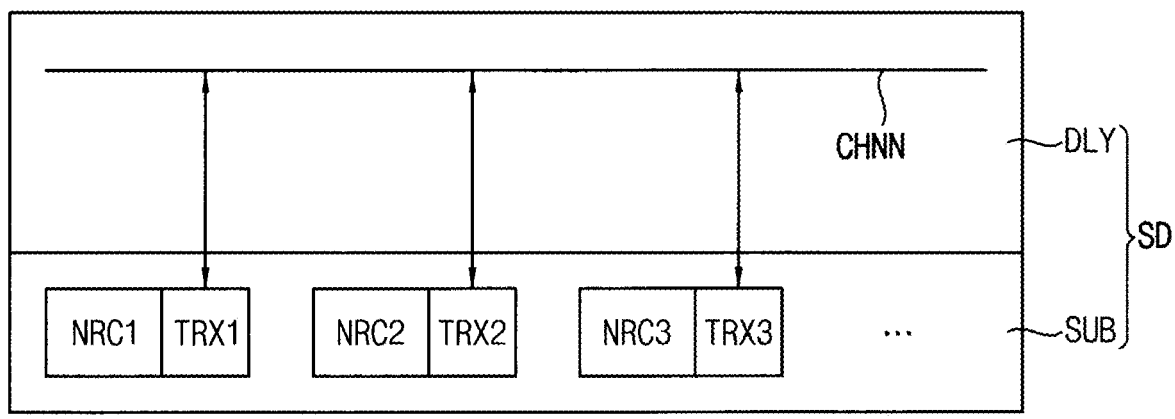
FIGS. 17 through 20 are diagrams illustrating a neuromorphic system according to example embodiments.

Referring to FIG. 17, a neuromorphic system 600 may include a plurality of neuromorphic devices NDEV that are included in a same semiconductor die SD including a semiconductor substrate SUB and dielectric layer DLY on (or above) the semiconductor substrate SUB. A first neuromorphic device may include a first neuromorphic core NRC1 and a first spike transceiver circuit TRX1, a second neuromorphic device may include a second neuromorphic core NRC2 and a second spike transceiver circuit TRX2, and a third neuromorphic device may include a third neuromorphic core NRC3 and a third spike transceiver circuit TRX3. A transfer channel CHNN for transferring non-binary signals between the plurality of neuromorphic devices may be included in a metal line that is formed in the dielectric layer DLY on (or above) the semiconductor substrate SUB.

Figure 18:
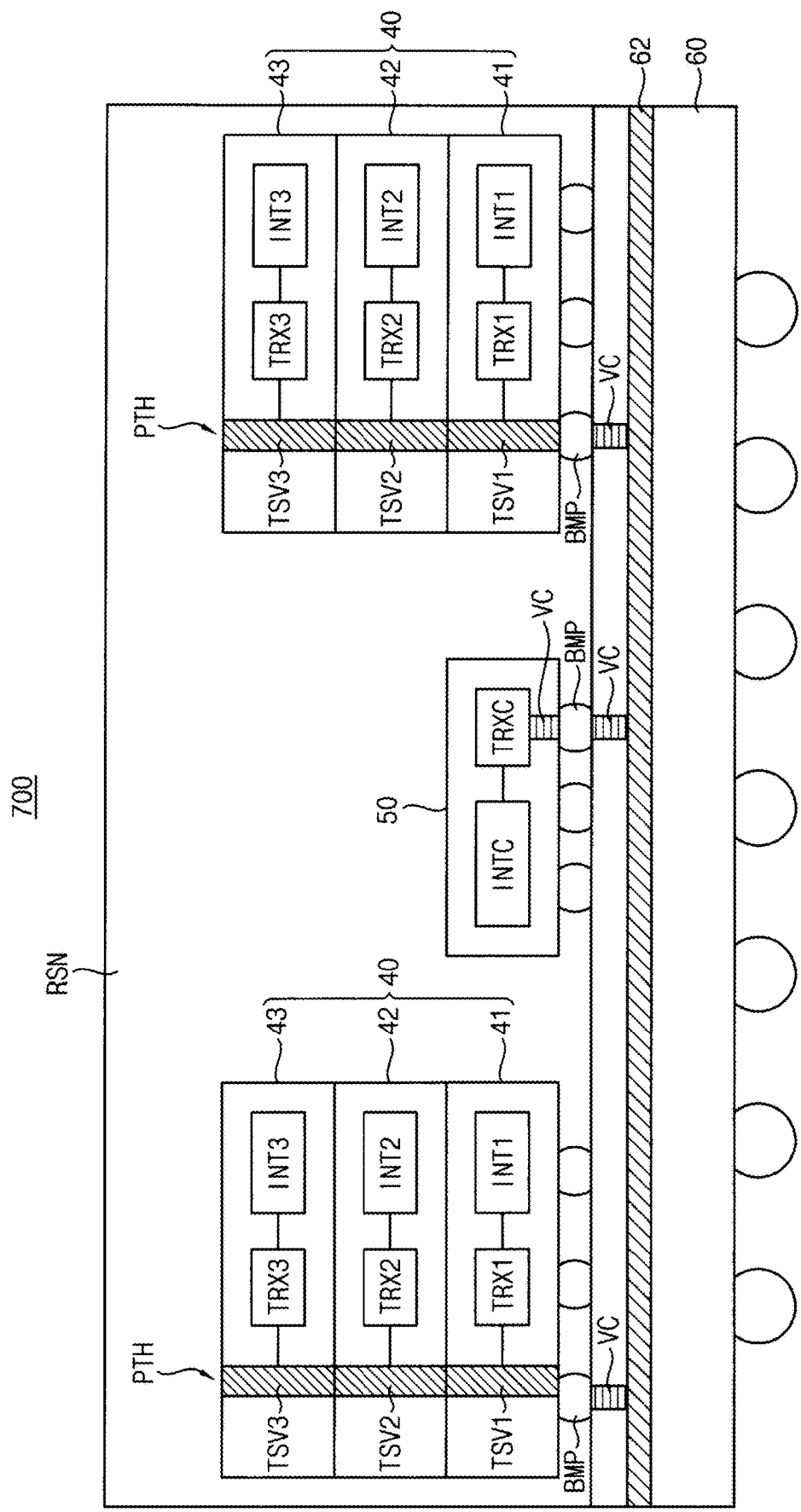

Referring to FIG. 18, a neuromorphic system 700 includes a base substrate 60 and a plurality of semiconductor dies 41, 42, 43 and 50 that are stacked on the base substrate 60. The stacked semiconductor dies 41, 42 and 43 may be packaged as a chip 40 and the semiconductor die 50 may be packaged as another separate chip. The packaged chips 40 and 50 may be mounted on the base substrate 60 using the bumps BMP, and may be electrically connected to each other through the bumps BMP, the vertical contacts VC and/or the signal lines 62 of the base substrate 60.

The stacked semiconductor chip 40 includes the plurality of semiconductor dies 41, 42 and 43 that are stacked in a vertical direction. FIG. 18 illustrates a non-limiting example of the three stacked semiconductor dies 41, 42 and 43, and the number of the stacked semiconductor dies in the stacked semiconductor chip 40 may vary. The semiconductor dies 41, 42 and 43 may include internal circuits INT1, INT2 and INT3, transceiver circuits TRX1, TRX2 and TRX3 and through-silicon vias or through-substrate vias TSV1, TSV2 and TSV3, respectively. The other semiconductor die 50 may include an internal circuit INTC, a transceiver circuit TRXC and/or vertical contacts VC.

Each data path PTH may include the through-substrate vias TSV1, TSV2 and TSV3 formed in the semiconductor dies 41, 42 and 43, respectively. Even though FIG. 18 illustrates that the two through-substrate vias in the adjacent semiconductor dies are connected directly, the through-substrate vias may be electrically connected to one another through bumps, pads, metal wires, etc.

Each internal circuit INTi (i=, 1, 2, 3) and INTC may include various integrated circuits according to the kind of the semiconductor chips 40 and 50. For example, the stacked semiconductor chip 40 may be a neuromorphic device including at least one neuron block as described above. Each transceiver circuit TRXi and TRXC may be a spike transceiver circuit configured to convert spike information to a non-binary signal and/or vice versa and transfer the non-binary signal between the neuron blocks.

As such, a first neuromorphic device may be included in a first semiconductor, and the second neuromorphic device may be included in a second semiconductor die that is stacked with the first semiconductor die in a vertical direction. In some example embodiments, the transfer channel for transferring the non-binary signal may include through-substrate vias formed in the first semiconductor die and the second semiconductor. As illustrated in FIG. 18, the transfer channel may further include the signal line 62 formed at the base substrate 60 on which the package chips 40 and 50 are mounted such that the non-binary signal may be transferred through the signal line 62 between the package chips 40 and 50.

Figure 19:
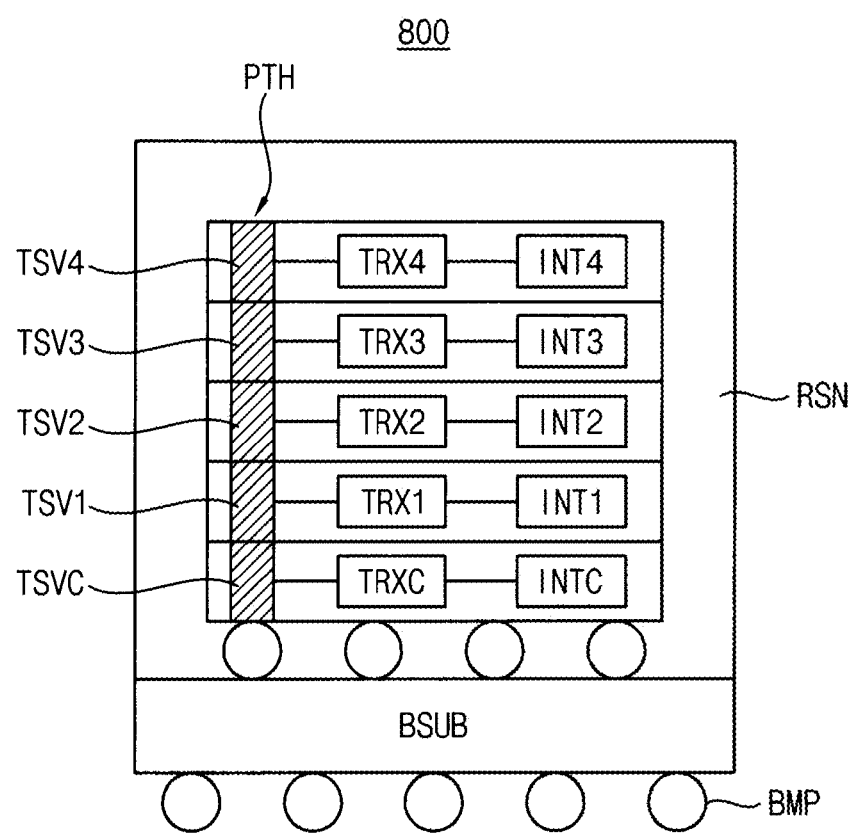

FIG. 18 illustrates a structure in which the semiconductor dies 41, 42 and 43 including the neuromorphic devices except for the logic semiconductor die 50 are stacked vertically and the logic semiconductor die 50 is electrically connected to the package chips 40 through the interposer or the base substrate 60. FIG. 19 illustrates a structure in which the logic semiconductor die is stacked vertically with the semiconductor dies including the neuromorphic devices.

Referring to FIG. 19, a neuromorphic system 800 may include a base substrate BSUB and a plurality of semiconductor dies stacked on the base substrate BSUB. The lowest semiconductor die may be the logic semiconductor die and above-described neuromorphic devices may be formed in the semiconductor dies above the logic semiconductor die.

The base substrate BSUB may be the same as the interposer ITP or include the interposer ITP. The base substrate BSUB may be a printed circuit board (PCB). External connecting elements such as conductive bumps BMP may be formed on a lower surface of the base substrate BSUB and internal connecting elements such as conductive bumps may be formed on an upper surface of the base substrate BSUB. The stacked semiconductor dies may be packaged using resin RSN.

Figure 20:
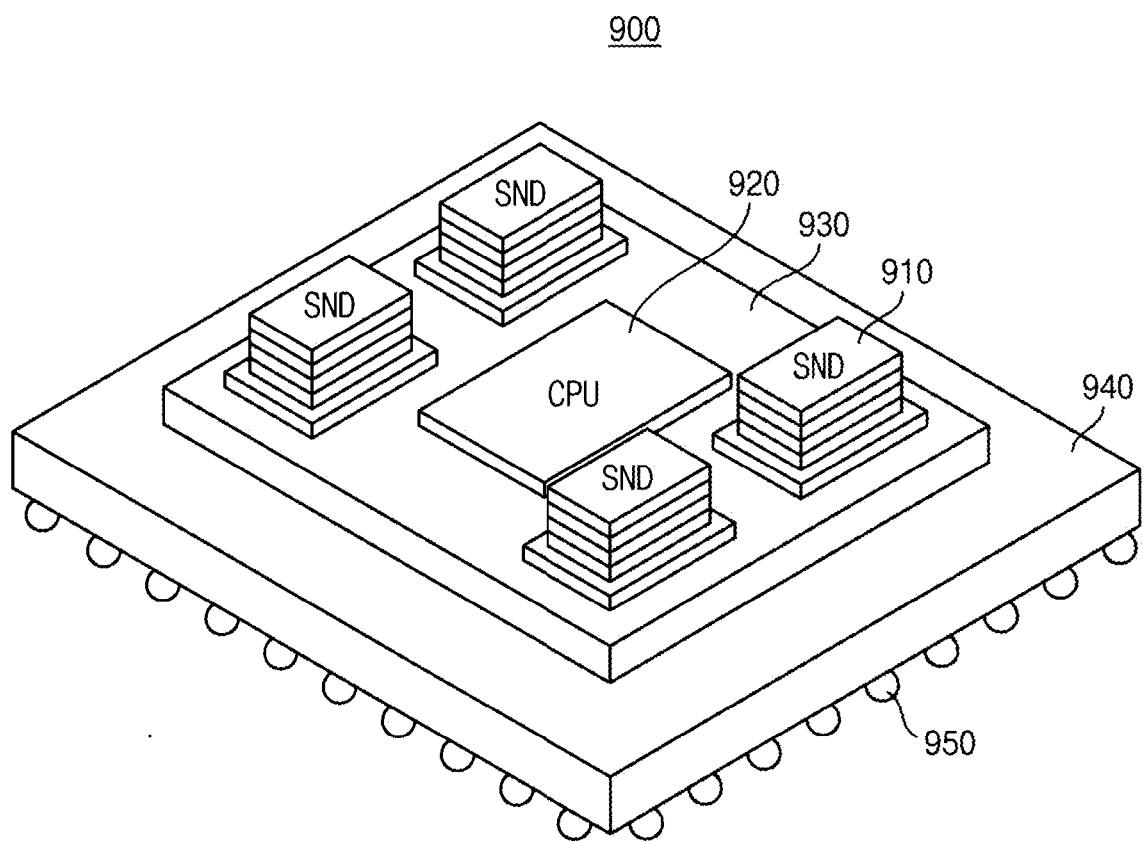

FIG. 20 illustrates a semiconductor package including a plurality of neuromorphic devices according to example embodiments. Referring to FIG. 20, a semiconductor package 900 may include one or more stacked neuromorphic devices SND 910, and a central processing unit (CPU) 920. The stacked neuromorphic devices 910 and the CPU 920 may be mounted on an interposer 930, and the interposer 930 may be mounted on a package substrate 940.

The stacked neuromorphic devices 910 may be packaged into package chips, and the package chip may be mounted on the interposer 930 of the base substrate 940. A first neuromorphic device may be included in a first package chip, and the second neuromorphic device may be included a second package chip distinct from the first package chip. In some example embodiments, the above-described transfer channel for transferring the non-binary signal may include a signal line formed in the interposer 930 or the base substrate 940 on which the first package chip and the second package chip are mounted.

Figure 21:
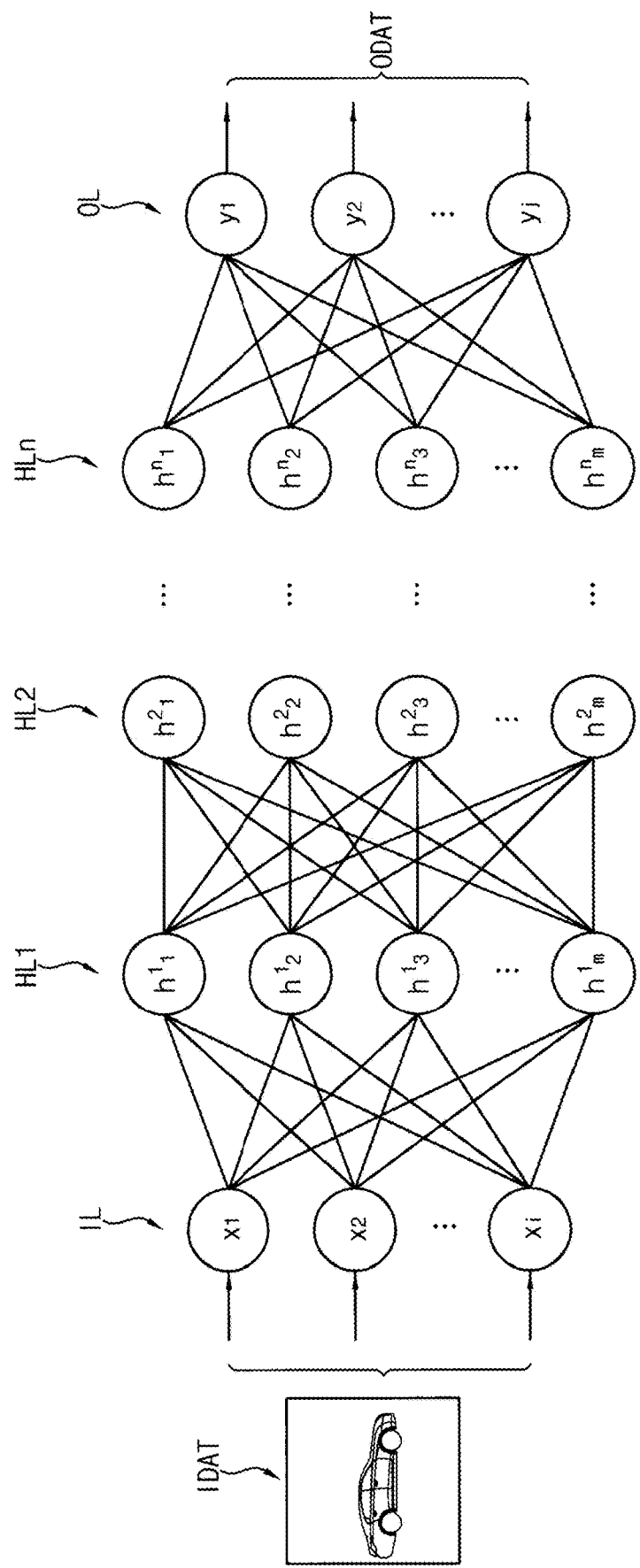
FIGS. 21 and 22 are diagrams for describing examples of a deep learning neural network structure that is driven by a neuromorphic system according to example embodiments.
Figure 22:
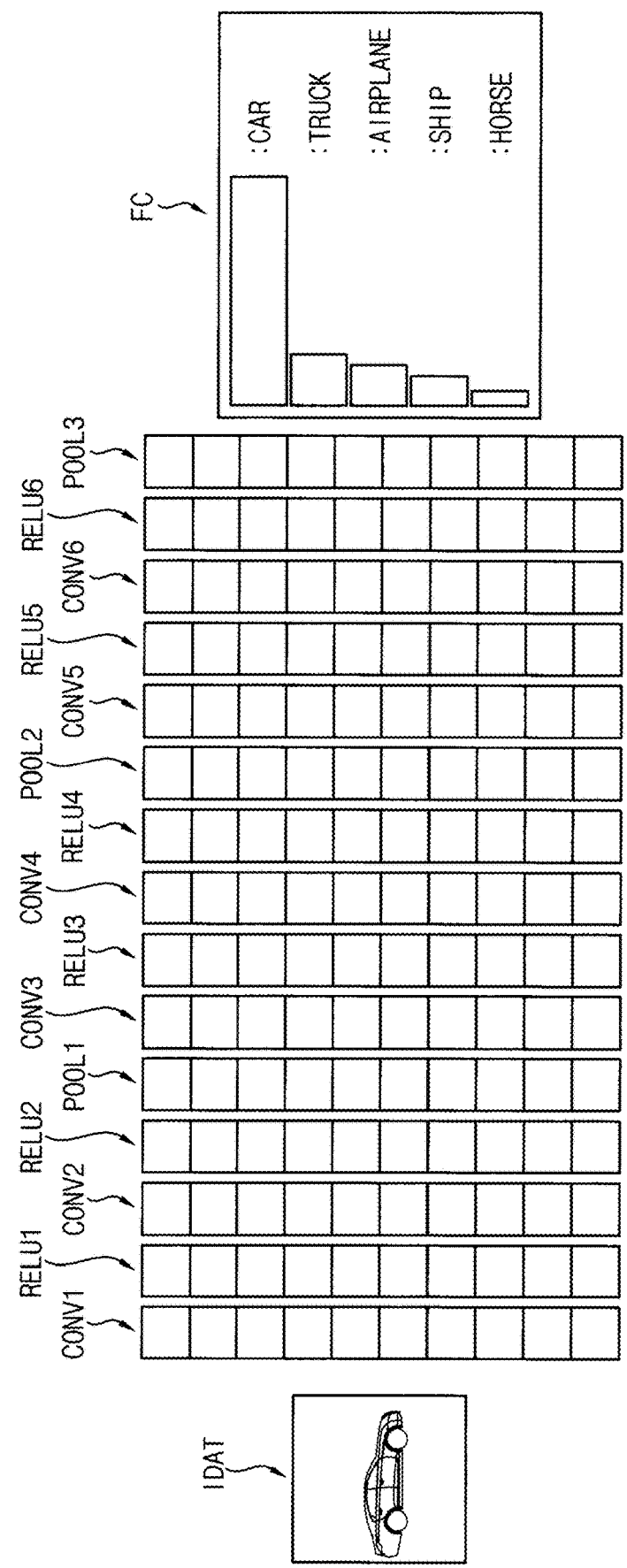

FIGS. 21 and 22 are diagrams for describing examples of a deep learning neural network structure that is driven by a neuromorphic system according to example embodiments.

A neuromorphic system according to example embodiments may be used to drive a neural network system and/or a machine learning system such as an artificial neural network (ANN) system, a convolutional neural network (CNN) system, a deep neural network (DNN) system, a deep learning system, deconvolutional neural networks, recurrent neural networks (RNN) optionally including long short-term memory (LSTM) units and/or gated recurrent units (GRU), stacked neural networks (SNN), state-space dynamic neural networks (SSDNN), deep belief networks (DBN), generative adversarial networks (GANs), and/or restricted Boltzmann machines (RBM).

Alternatively or additionally, such machine learning systems may include other forms of machine learning models, such as, for example, linear and/or logistic regression, statistical clustering, Bayesian classification, decision trees, dimensionality reduction such as principal component analysis, and expert systems; and/or combinations thereof, including ensembles such as random forests.

For example, various services and/or applications such as an image classify service, a user authentication service, an advanced driver assistance system (ADAS) service, a voice assistant service, an automatic speech recognition (ARS) service, etc. may be executed and processed by the neuromorphic system.

Referring to FIG. 21, a general neural network may include an input layer IL, a plurality of hidden layers HL1, HL2, . . . , HLn and an output layer OL.

The input layer IL may include i input nodes x1, x2, . . . , xi, where i is a natural number. Input data (e.g., vector input data) IDAT whose length is i may be input to the input nodes x1, x2, . . . , xi such that each element of the input data IDAT is input to a respective one of the input nodes x1, x2, . . . , xi.

The plurality of hidden layers HL1, HL2, HLn may include n hidden layers, where n is a natural number, and may include a plurality of hidden nodes $h^1_1, h^1_2, h^1_3, \ldots, h^1_m, h^2_1, h^2_2, h^2_3, \ldots, h^2_m, h''_1, h''_2, h''_3, \ldots, h''_m$. For example, the hidden layer HL1 may include m hidden nodes $h^1_1, h^1_2, h^1_3, \ldots, h^1_m$, the hidden layer HL2 may include m hidden nodes $h^2_1, h^2_2, h^2_3, \ldots, h^2_m$, and the hidden layer HLn may include m hidden nodes $h''_1, h''_2, h''_3, \ldots, h''_m$, where m is a natural number.

The output layer OL may include j output nodes $y_1, y_2, \ldots, y_j$, where j is a natural number. Each of the output nodes $y_1, y_2, \ldots, y_j$ may correspond to a respective one of classes to be categorized. The output layer OL may output the output values (e.g., class scores or simply scores) associated with the input data IDAT for each of the classes. The output layer OL may be referred to as a fully-connected layer and may indicate, for example, a probability that the input data IDAT corresponds to a car.

A structure of the neural network illustrated in FIG. 21 may be represented by information on branches (or connections) between nodes illustrated as lines, and a weighted value assigned to each branch. Nodes within one layer may not be connected to one another, but nodes of different layers may be fully or partially connected to one another.

Each node (e.g., the node $h^1_1$) may receive an output of a previous node (e.g., the node $x_1$), may perform a computing operation, computation or calculation on the received output, and may output a result of the computing operation, computation or calculation as an output to a next node (e.g., the node $h^2_1$). Each node may calculate a value to be output by applying the input to a specific function, e.g., a nonlinear function.

Generally, the structure of the neural network may be set in advance, and the weighted values for the connections between the nodes are set appropriately using data having an already known answer of which class the data belongs to. The data with the already known answer is referred to as "training data," and a process of determining the weighted value is referred to as "training." The neural network "learns" during the training process. A group of an independently trainable structure and the weighted value is referred to as a "model," and a process of predicting, by the model with the determined weighted value, which class the input data belongs to, and then outputting the predicted value, is referred to as a "testing" process.

Referring to FIG. 22, a convolutional neural network may include a plurality of layers CONV1, RELU1, CONV2, RELU2, POOL1, CONV3, RELU3, CONV4, RELU4, POOL2, CONV5, RELU5, CONV6, RELU6, POOLS and FC.

Unlike the general neural network, each layer of the convolutional neural network may have three dimensions of width, height and depth, and thus data that is input to each layer may be volume data having three dimensions of width, height and depth. For example, if an input image in FIG. 22 has a size of 32 width units (e.g., 32 pixels) and 32 height units (e.g., 32 pixels) and three color channels R, G and B, input data IDAT corresponding to the input image may have a size of 32×32×3. The input data IDAT in FIG. 3B may be referred to as input volume data or input activation volume.

Each of convolutional layers CONV1, CONV2, CONV3, CONV4, CONV5 and CONV6 may perform a convolutional operation on input volume data. In an image processing, the convolutional operation represents an operation in which image data is processed based on a mask with weighted values and an output value is obtained by multiplying input values by the weighted values and adding up the total multiplied values. The mask may be referred to as a filter, window or kernel.

Each of RELU layers RELU1, RELU2, RELU3, RELU4, RELU5 and RELU6 may perform a rectified linear unit operation on inputs. Each of pooling layers POOL1, POOL2 and POOL3 may perform a down-sampling operation on input volume data along spatial dimensions of width and height. Typically, one convolutional layer (e.g., CONV1) and one RELU layer (e.g., RELU1) may form a pair of CONV/RELU layers in the convolutional neural network, pairs of the CONV/RELU layers may be repeatedly arranged in the convolutional neural network, and the pooling layer may be periodically inserted in the convolutional neural network, thereby reducing an image spatial size and extracting an image characteristic.

An output layer or a fully-connected layer FC may output results (e.g., class scores) of the input volume data IDAT for each of the classes. For example, the input volume data IDAT corresponding to the two-dimensional image may be converted into a one-dimensional matrix or vector as the convolutional operation and the down-sampling operation are repeated. For example, the fully-connected layer FC may represent probabilities that the input volume data IDAT corresponds to a car, a truck, an airplane, a ship and a horse.

Figure 23:
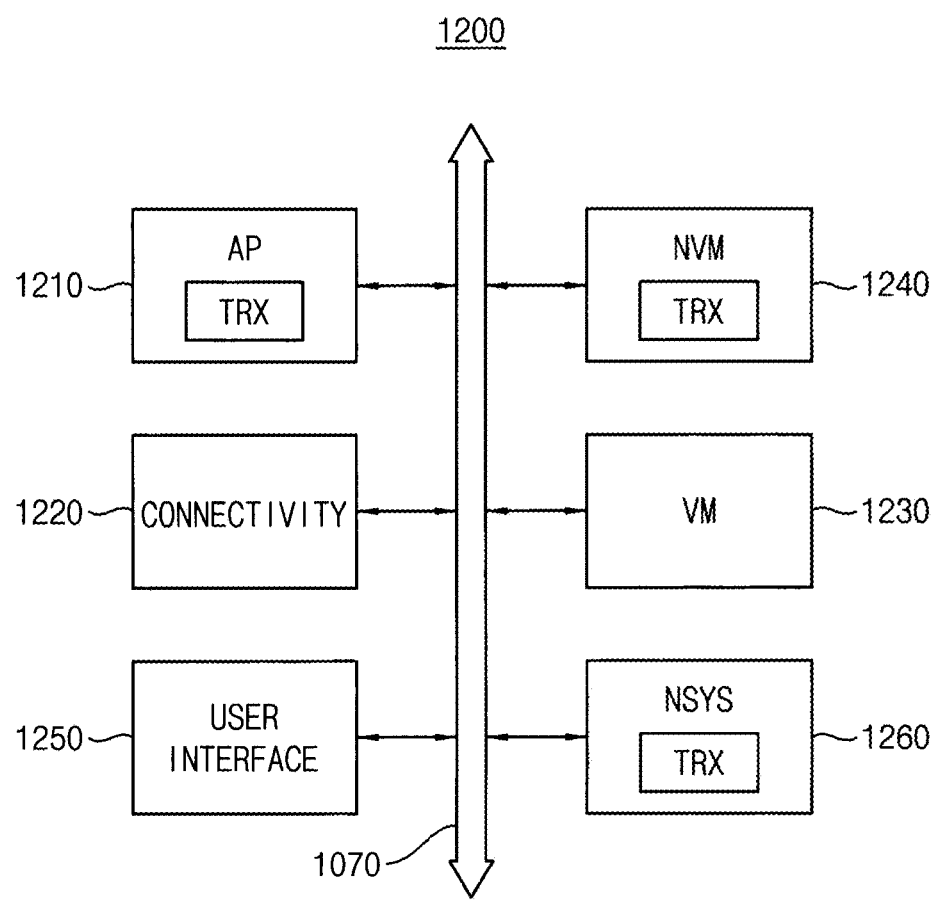
FIG. 23 is a block diagram illustrating a computing system according to example embodiments.

FIG. 23 is a block diagram illustrating a computing system according to example embodiments.

Referring to FIG. 23, a computing system 1200 includes an application processor 1210, a connectivity unit 1220, a volatile memory device (VM) 1230, a nonvolatile memory device 1240, a user interface 1250, and a neuromorphic system 1260, any or all of which may be implemented in processing circuitry. According to example embodiments, the computing system 1200 may correspond to a mobile device such as a smartphone, etc.

The application processor 1210 may execute applications such as a web browser, a game application, a video player, etc. The connectivity unit 1220 may perform wired or wireless communication with an external device. The volatile memory device 1230 may store data processed by the application processor 1210, or may operate as a working memory. The nonvolatile memory device 1240 may store a boot image for booting the mobile system 1200. The user interface 1250 may include at least one input device, such as a keypad, a touch screen, etc., and at least one output device, such as a speaker, a display device, etc.

The neuromorphic system 1260 may include at least one neuron block and a spike transceiver circuit TRX configured to transmit and/or receive non-binary signal including spike information as described above. In addition, also the application processor 1210 and/or the volatile memory device 1230 may include the spike transceiver circuit TRX.

As described above, the neuromorphic device and the neuromorphic system according to example embodiments may implement a spiking neural network efficiently by packetizing the spike signals and modulating the packet to transfer the spike signals as the non-binary signals.

The inventive concepts may be applied to any electronic devices and systems. For example, the inventive concepts may be applied to systems such as a mobile phone, a smart phone, a personal digital assistant (PDA), a portable multimedia player (PMP), a digital camera, a camcorder, a personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, etc.

The foregoing is illustrative of example embodiments and is not to be construed as limiting thereof. Although a few example embodiments have been described, those skilled in the art will readily appreciate that many modifications are possible in the example embodiments without materially departing from the present inventive concepts.

What is claimed is:

1. A neuromorphic device comprising:
a neuron block including a plurality of neurons connected by a plurality of synapses to perform generation and operation of spikes;
a spike transmission circuit configured to generate a non-binary transmission signal, including a transmission packet, based on a plurality of transmission spike signals output from the neuron block and configured to transmit the non-binary transmission signal to a transfer channel, the non-binary transmission signal including information on transmission spikes included in the plurality of transmission spike signals; and
a spike reception circuit configured to receive a non-binary reception signal from the transfer channel and configured to generate a plurality of reception spike signals including reception spikes based on the non-binary reception signal to provide the plurality of reception spike signals to the neuron block, the non-binary reception signal including information on the reception spikes,
wherein the transmission packet includes a header, the header including an identifier of the neuron block generating the transmission spikes, and a payload including timing information for the transmission spikes,
the spike transmission circuit is configured to generate the transmission packet based on the information on the transmission spikes, to generate header parity bits by performing error correction code (ECC) encoding with respect to the header, and to generate spike parity bits by performing ECC encoding with respect to the payload, and
the non-binary transmission signal has four voltage levels that are mapped to two-bit data, such that the header and the header parity bits are disposed at a first bit of the two-bit data and the timing information and the spike parity bits are disposed at a second bit of the two-bit data.

2. The neuromorphic device of claim 1, wherein the non-binary transmission signal and the non-binary reception signal are pulse-based signals.

3. The neuromorphic device of claim 1, wherein the non-binary transmission signal and the non-binary reception signal are pulse amplitude modulation (PAM) signals.

4. The neuromorphic device of claim 1, wherein the spike transmission circuit is configured to modulate the transmission packet to generate the non-binary transmission signal.

5. The neuromorphic device of claim 4, wherein
the header includes a number of spikes included in the transmission packet, and
the payload includes identifiers of reception neurons to receive the transmission spikes.

6. The neuromorphic device of claim 1, wherein the spike reception circuit is configured to demodulate the non-binary reception signal to generate a reception packet and is configured to generate the plurality of reception spike signals based on the reception packet including identifiers of reception neurons to receive the reception spikes and timing information of the reception spikes.

7. The neuromorphic device of claim 1, wherein the spike transmission circuit includes:
a spike converter configured to generate transmission spike data including the timing information of the transmission spikes;
a packetizer configured to generate the transmission packet based on the transmission spike data; and
a modulator configured to modulate the transmission packet to generate the non-binary transmission signal.

8. The neuromorphic device of claim 7, wherein the spike transmission circuit further includes:
an error correction code (ECC) encoder configured to generate at least one of the header or spike parity bits by performing ECC encoding with respect to at least one of the header or the payload of the transmission packet,
wherein the packetizer adds the at least one of the header or spike parity bits to the transmission packet.

9. The neuromorphic device of claim 1, wherein the spike reception circuit includes:
a demodulator configured to demodulate the non-binary reception signal to generate a reception packet;
a depacketizer configured to generate, based on the reception packet, reception spike data including timing information of the reception spikes; and
a spike generator configured to generate the plurality of reception spike signals based on the reception spike data.

10. The neuromorphic device of claim 9, wherein the spike reception circuit further includes:
an error correction code (ECC) decoder configured to correct errors in the reception packet based on parity bits included in the reception packet.

11. The neuromorphic device of claim 1, wherein the neuron block, the spike transmission circuit and the spike reception circuit are included in a same semiconductor die.

12. A neuromorphic system comprising:
a plurality of neuromorphic devices; and
a transfer channel configured to electrically connect the plurality of neuromorphic devices,
wherein each of the plurality of neuromorphic devices comprises:
a neuron block including a plurality of neurons connected by a plurality of synapses to perform generation and operation of spikes;
a spike transmission circuit configured to generate a non-binary transmission signal, including a transmission packet, based on a plurality of transmission spike signals output from the neuron block and configured to transmit the non-binary transmission signal to the transfer channel, the non-binary transmission signal including information on transmission spikes included in the plurality of transmission spike signals; and a spike reception circuit configured to receive a non-binary reception signal from the transfer channel and configured to generate a plurality of reception spike signals including reception spikes based on the non-binary reception signal to provide the plurality of reception spike signals to the neuron block, the non-binary reception signal including information on the reception spikes, wherein the transmission packet includes a header, the header including an identifier of the neuron block generating the transmission spikes, and a payload including timing information for the transmission spikes, the spike transmission circuit is configured to generate the transmission packet based on the information on the transmission spikes, to generate header parity bits by performing error correction code (ECC) encoding with respect to the header, and to generate spike parity bits by performing ECC encoding with respect to the payload, and the non-binary transmission signal has four voltage levels that are mapped to two-bit data, such that the header and the header parity bits are disposed at a first bit of the two-bit data and the timing information and the spike parity bits are disposed at a second bit of the two-bit data.

13. The neuromorphic system of claim 12, wherein the plurality of neuromorphic devices includes a first neuromorphic device and a second neuromorphic device, the first neuromorphic device configured to transmit the non-binary transmission signal to the transfer channel using the spike transmission circuit, and the second neuromorphic device configured to receive, as the non-binary reception signal, the non-binary transmission signal provided through the transfer channel from the first neuromorphic device, and wherein the plurality of neuromorphic devices form a spiking neural network.

14. The neuromorphic system of claim 13, wherein the first neuromorphic device and the second neuromorphic device are included in a same semiconductor die, and the transfer channel includes a metal line that is formed above a semiconductor substrate in the semiconductor die.

15. The neuromorphic system of claim 13, wherein the first neuromorphic device is included in a first semiconductor die, and the second neuromorphic device is included in a second semiconductor die that is stacked with the first semiconductor die in a vertical direction, and the transfer channel includes through-substrate vias in the first semiconductor die and the second semiconductor die.

16. The neuromorphic system of claim 13, wherein the first neuromorphic device is included in a first package chip, and the second neuromorphic device is included in a second package chip distinct from the first package chip, and the transfer channel includes a signal line at a base substrate on which the first package chip and the second package chip are mounted.

17. The neuromorphic system of claim 12, wherein the non-binary transmission signal and the non-binary reception signal are pulse amplitude modulation (PAM) signals.

18. A neuromorphic device comprising:

a neuron block including a plurality of neurons connected by a plurality of synapses to perform generation and operation of spikes;

a spike transmission circuit configured to generate a pulse amplitude modulation (PAM) transmission signal based on a plurality of transmission spike signals output from the neuron block and configured to transmit the PAM transmission signal to a transfer channel; and a spike reception circuit configured to receive a PAM reception signal from the transfer channel, wherein the spike transmission circuit comprises:
a spike converter configured to generate transmission spike data including timing information of transmission spikes based on the plurality of transmission spike signals output from the neuron block;
a packetizer configured to generate a transmission packet based on the transmission spike data, the transmission packet includes a header, the header including an identifier of the neuron block;
an error correction code (ECC) encoder configured to generate header parity bits and spike parity bits by performing ECC encoding with respect to the header and a payload of the transmission packet; and
a modulator configured to modulate the transmission packet to generate the PAM transmission signal, and wherein the spike reception circuit comprises:
a demodulator configured to demodulate the PAM reception signal to generate a reception packet;
a depacketizer configured to generate, based on the reception packet, reception spike data including timing information of the reception spikes; and
a spike generator configured to generate a plurality of reception spike signals based on the reception spike data, wherein the PAM transmission signal has four voltage levels that are mapped to two-bit data, such that the header and the header parity bits are disposed at a first bit of the two-bit data and the timing information and the spike parity bits are disposed at a second bit of the two-bit data.

* * * * *